United States Patent
Song

(10) Patent No.: US 11,921,578 B2
(45) Date of Patent: Mar. 5, 2024

(54) ERROR CORRECTION METHODS AND SEMICONDUCTOR DEVICES AND SEMICONDUCTOR SYSTEMS USING THE ERROR CORRECTION METHODS AND THE SEMICONDUCTOR DEVICES

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 245 days.

(21) Appl. No.: 17/504,936

(22) Filed: Oct. 19, 2021

(65) Prior Publication Data

US 2022/0035704 A1 Feb. 3, 2022

Related U.S. Application Data

(63) Continuation-in-part of application No. 16/943,788, filed on Jul. 30, 2020, now Pat. No. 11,276,451.

(30) Foreign Application Priority Data

Mar. 31, 2020 (KR) .......................... 10-2020-0039316

(51) Int. Cl.
*G11C 29/42* (2006.01)
*G06F 11/10* (2006.01)
*H03M 13/15* (2006.01)
*G11C 7/10* (2006.01)

(52) U.S. Cl.
CPC ..... *G06F 11/1068* (2013.01); *H03M 13/1575* (2013.01); *G11C 7/10* (2013.01)

(58) Field of Classification Search
CPC .............. G11C 11/406; G11C 11/4096; G11C 2211/4062
USPC ...................................................... 365/189.14
See application file for complete search history.

(56) References Cited

U.S. PATENT DOCUMENTS

| 10,037,246 | B1 | 7/2018 | Laws et al. |
| 11,276,451 | B2 * | 3/2022 | Song .................... G11C 11/406 |
| 2017/0068584 | A1 | 3/2017 | Park et al. |
| 2017/0242749 | A1 | 8/2017 | Park |
| 2019/0285667 | A1 | 9/2019 | Milano et al. |
| 2019/0385667 | A1 | 12/2019 | Morohashi et al. |

FOREIGN PATENT DOCUMENTS

| KR | 100379812 B1 | 6/2003 |
| KR | 1020180061445 A | 6/2018 |
| KR | 1020180079495 A | 7/2018 |

* cited by examiner

*Primary Examiner* — Huan Hoang
(74) *Attorney, Agent, or Firm* — William Park & Associates Ltd.

(57) ABSTRACT

An electronic device includes an error correction circuit configured to detect an error included in internal data, to generate a failure detection signal during a read operation, and to correct the error included in the internal data during a refresh operation, and a core circuit configured to store an address signal for activating a word line in which the internal data including the error is stored through as a failure address signal when the failure detection signal is input to the core circuit, and store the error-corrected internal data in the core circuit through a word line activated by the failure address signal during the refresh operation.

27 Claims, 25 Drawing Sheets

ERROR CORRECTION METHODS AND SEMICONDUCTOR DEVICES AND SEMICONDUCTOR SYSTEMS USING THE ERROR CORRECTION METHODS AND THE SEMICONDUCTOR DEVICES

CROSS-REFERENCES TO RELATED APPLICATION

This application is a continuation-in-part of U.S. patent application Ser. No. 16/943,788, filed on Jul. 30, 2020, which claims the priority of Korean Patent Application No. 10-2020-0039316, filed on Mar. 31, 2020 in the Korean Intellectual Property Office.

BACKGROUND

1. Technical Field

The present disclosure relates to an error correction method for correcting an error in internal data stored in a word line activated by a failure address and storing the error-corrected internal data during a refresh operation, and to a semiconductor device and a semiconductor system using the error correction method and the semiconductor device.

2. Related Art

Recently, various design schemes for receiving or outputting multi-bit data during individual clock cycles have been used to improve operation speeds of semiconductor devices. If a data transmission speed of a semiconductor device becomes faster, the probability of an error occurrence may increase while the data are transmitted in the semiconductor device. Accordingly, advanced design techniques may be required to guarantee the reliable transmission of data in semiconductor devices.

Whenever data are transmitted in semiconductor devices, error codes which are capable of detecting the occurrence of errors may be generated and transmitted with the data to improve the reliability of the data transmission. The error codes may include a cyclic redundancy check and an error detection code (EDC), which are capable of detecting errors, and an error correction code (ECC), which is capable of correcting the errors by itself.

SUMMARY

In an embodiment, a semiconductor device may include an error correction circuit configured to detect an error included in internal data, to generate a failure detection signal during a read operation, and to correct the error included in the internal data during a refresh operation, and a core circuit configured to store an address signal for activating a word line in which the internal data including the error is stored as a failure address signal when the failure detection signal is input to the core circuit, and store the error-corrected internal data in the core circuit through a word line activated by the failure address signal during the refresh operation.

In an embodiment, a semiconductor device may include an error correction circuit configured to detect an error included in first and second internal data, to generate a failure detection signal during a read operation, and to correct the error included in the first and second internal data during a refresh operation, a refresh control circuit configured to store an address signal for activating a word line in which the first and second internal data including an error are stored as first and second failure address signals, to output the first and second failure address signals during the refresh operation, and to control a read modify write operation during the refresh operation, and a core circuit configured to output the first and second internal data stored in the core circuit through the word line activated by the first and second failure address signals during the read modify write operation, and then, store the error-corrected first and second internal data.

In an embodiment, a semiconductor device may include an error correction circuit configured to detect an error included in internal data, to generate a failure detection signal during a read operation, and to correct the error included in the internal data during a refresh operation, a core circuit configured to store an address signal for activating a word line in which the internal data including the error is stored as a failure address signal when the failure detection signal is input to the core circuit and store the error-corrected internal data in the core circuit through a word line activated by the failure address during the refresh operation, and a repair control circuit configured to generate a repair signal for replacing the word line in which the internal data is stored through with another word line when the failure address signal is generated with the same logic level combination.

In an embodiment, a semiconductor system may include a controller configured to input/output a command signal, an address signal, and data, to store the address signal as a failure address signal when a failure detection signal is input to the controller, and to output the stored failure address signal during a refresh operation, and a semiconductor device configured to detect an error of internal data generated by the address signal to generate the failure detection signal based on the command signal during a read operation, correct the error included in the internal data to output the error-corrected internal data as the data, and correct the error of the internal data stored in the semiconductor device through a word line activated by the failure address signal to store the error-corrected internal data during the refresh operation.

In an embodiment, an error correction method may include an address detection operation of detecting an error included in internal data output from a memory region during a read operation, an error correction operation of generating a failure detection signal when an error is included in the internal data and correcting the error of the internal data, and an address storage operation of storing an address signal for activating a word line in which the internal data is stored as a failure address signal when the failure detection signal occurs, wherein the error-corrected internal data is stored in the word line activated by the failure address signal during a refresh operation.

DETAILED DESCRIPTION

In the following description of embodiments, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is being executed.

It will be understood that although the terms "first," "second," "third," etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
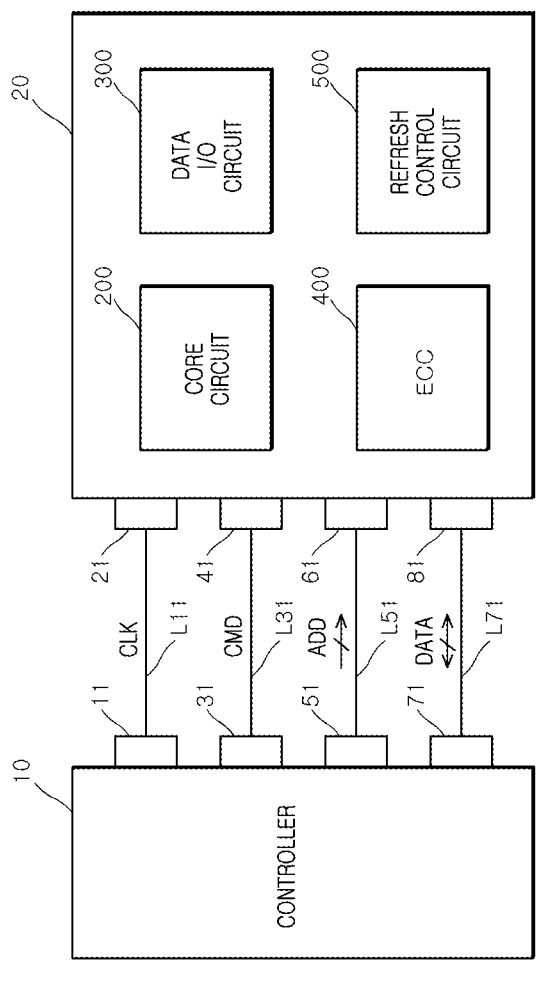
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As illustrated in FIG. 1, the semiconductor system 1 according to an embodiment of the present disclosure may include a controller 10 and a semiconductor device 20. The semiconductor device 20 may include a core circuit 200, a data input/output (I/O) circuit 300, an error correction circuit (ECC) 400, and a refresh control circuit 500.

The controller 10 may include a first control pin 11, a second control pin 31, a third control pin 51, and a fourth control pin 71. The semiconductor device 20 may include a first semiconductor pin 21, a second semiconductor pin 41, a third semiconductor pin 61, and a fourth semiconductor pin 81. The first control pin 11 and the first semiconductor pin 21 may be connected to each other through a first transmission line L11. The second control pin 31 and the second semiconductor pin 41 may be connected to each other through a second transmission line L31. The third control pin 51 and the third semiconductor pin 61 may be connected to each other through a third transmission line L51. The fourth control pin 71 and the fourth semiconductor pin 81 may be connected to each other through a fourth transmission line L71. The controller 10 may transmit a clock signal CLK to the semiconductor device 20 through the first transmission line L11 to control the semiconductor device 20. The controller 10 may transmit a command signal CMD to the semiconductor device 20 through the second transmission line L31 to control the semiconductor device 20. The controller 10 may transmit an address signal ADD to the semiconductor device 20 through the third transmission line L51 to control the semiconductor device 20. The controller 10 may receive data DATA from the semiconductor device 20 through the fourth transmission line L71 or may transmit the data DATA to the semiconductor device 20 through the fourth transmission line L71.

The controller 10 may output the clock signal CLK, the command signal CMD, and the address signal ADD to the semiconductor device 20 to perform a read operation. The controller 10 may receive the data DATA from the semiconductor device 20 during the read operation. The controller 10 may output the clock signal CLK, the command signal CMD, the address signal ADD, and the data DATA to the semiconductor device 20 to perform a write operation. The controller 10 may output the clock signal CLK and the command signal CMD to the semiconductor device 20 to perform a refresh operation. The command signal CMD, the address signal ADD, and the data DATA may be successively input or output in synchronization with an odd pulse or an even pulse included in the clock signal CLK.

The core circuit 200 may output the data DATA based on the command signal CMD and the address signal ADD in synchronization with the clock signal CLK during the read operation. The core circuit 200 may receive and store the data DATA based on the command signal CMD and the address signal ADD in synchronization with the clock signal CLK during the write operation. The core circuit 200 may sequentially activate multiple word lines included therein based on the command signal CMD in synchronization with the clock signal CLK during the refresh operation. The core circuit 200 may additionally activate a certain word line based on the command signal CMD in synchronization with the clock signal CLK during the refresh operation when at least one memory cell of memory cells connected to the certain word line is a failed memory cell storing internal data (ID<1:K> of FIG. 2) including an erroneous data. The core circuit 200 may perform a repair operation for replacing a word line connected to at least one failed memory cell storing the internal data (ID<1:K> of FIG. 2) including an erroneous data with a repair line.

The data input/output circuit 300 may generate the data DATA from the internal data (ID<1:K> of FIG. 2) during the read operation. The data input/output circuit 300 may generate the internal data (ID<1:K> of FIG. 2) from the data DATA during the write operation.

The error correction circuit 400 may detect an error of the internal data (ID<1:K> of FIG. 2) to generate a failure detection signal (FAIL of FIG. 2) during the read operation. The error correction circuit 400 may correct the error included in the internal data (ID<1:K> of FIG. 2) during the read operation. The error correction circuit 400 may detect an error of the internal data (ID<1:K> of FIG. 2) during the write operation to generate the failure detection signal (FAIL of FIG. 2). The error correction circuit 400 may detect the error of the internal data (ID<1:K> of FIG. 2) to correct the error included in the internal data (ID<1:K> of FIG. 2) during the write operation.

The refresh control circuit 500 may store the address signal ADD for selecting the internal data (ID<1:K> of FIG. 2) in response to the failure detection signal (FAIL of FIG. 2) during the read operation. The refresh control circuit 500 may store the address signal ADD for selecting the internal data (ID<1:K> of FIG. 2) in response to the failure detection signal (FAIL of FIG. 2) having high level during the read operation. The refresh control circuit 500 may generate a refresh address signal (REF_ADD<1:M> of FIG. 2) for sequentially activating multiple word lines during the refresh operation. The refresh control circuit 500 may generate the refresh address signal (REF_ADD<1:M> of FIG. 2) for activating a word line connected to memory cells storing the internal data (ID<1:K> of FIG. 2) from the stored address signal ADD during the refresh operation.

Figure 2:
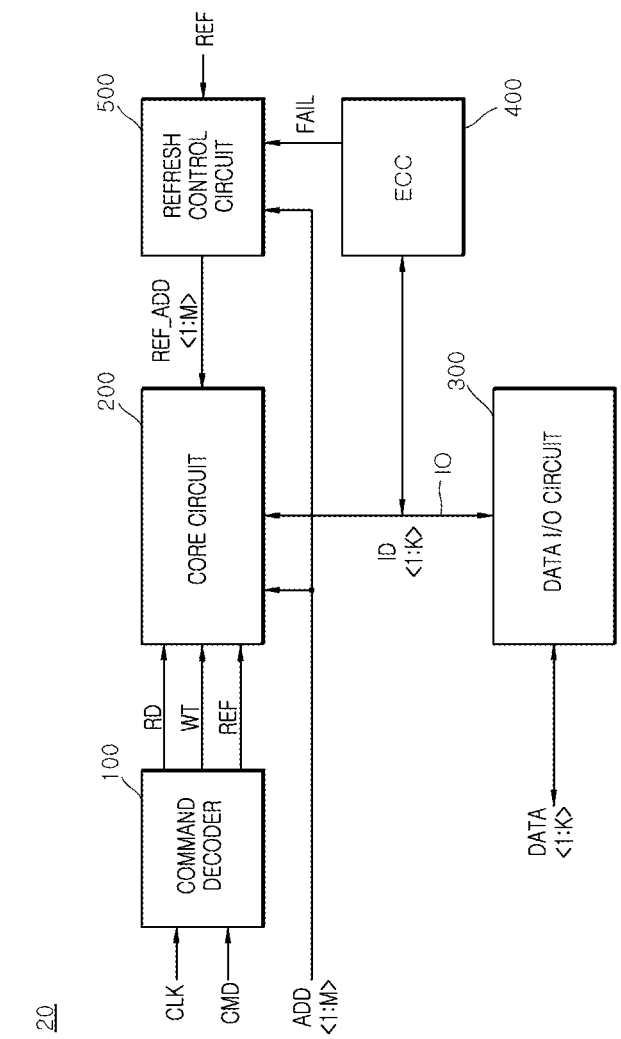
FIG. 2 is a block diagram illustrating a configuration of a semiconductor device included in the semiconductor system illustrated in FIG. 1.

FIG. 2 is a block diagram illustrating a configuration of the semiconductor device 20. As illustrated in FIG. 2, the semiconductor device 20 may include a command decoder 100, the core circuit 200, the data input/output circuit 300, the error correction circuit 400, and the refresh control circuit 500.

The command decoder 100 may be synchronized with the clock signal CLK to generate a read signal RD, a write signal WT, and a refresh signal REF, one of which is selectively enabled from the command signal CMD. The command decoder 100 may generate the read signal RD for performing the read operation by decoding the command signal CMD in synchronization with the clock signal CLK. The command decoder 100 may generate the write signal WT for performing the write operation by decoding the command signal CMD in synchronization with the clock signal CLK. The command decoder 100 may generate the refresh signal REF for performing the refresh operation by decoding the command signal CMD in synchronization with the clock signal CLK.

During the read operation, the core circuit 200 may output internal data ID<1:K> stored therein based on the read signal RD and the address signal ADD<1:M>. The core circuit 200 may store the internal data ID<1:K> based on the write signal WT and the address signal ADD<1:M> during the write operation. The core circuit 200 may perform the refresh operation for activating the multiple word lines based on the refresh signal REF and a refresh address signal REF_ADD<1:M> during the refresh operation. The internal data ID<1:K> may be output from the core circuit 200 through an input/output line JO during the read operation. The internal data ID<1:K> may be input to the core circuit 200 through the input/output line JO during the write operation.

The data input/output circuit 300 may buffer the internal data ID<1:K> loaded on the input/output line JO to generate the data DATA<1:K> during the read operation. The data input/output circuit 300 may output the data DATA<1:K> to the controller 10 during the read operation. The data input/output circuit 300 may buffer the data DATA<1:K> to generate the internal data ID<1:K> during the write operation. The data input/output circuit 300 may output the internal data ID<1:K> to the input/output line JO during the write operation. Although FIG. 2 illustrates the input/output line JO with a single line, the input/output line JO may be configured to include multiple lines.

The error correction circuit 400 may detect an error of the internal data ID<1:K> loaded on the input/output line JO during the read operation. The error correction circuit 400 may correct the error of the internal data ID<1:K> during the read operation and may output the corrected data of the internal data ID<1:K> to the input/output line JO. The error correction circuit 400 may generate the failure detection signal FAIL which is enabled when an error occurs in the internal data ID<1:K> loaded on the input/output line IO during the read operation. The error correction circuit 400 may detect the error of the internal data ID<1:K> loaded on the input/output line IO during the write operation. The error correction circuit 400 may correct the error of the internal data ID<1:K> during the write operation and may output the corrected data of the internal data ID<1:K> to the input/ output line IO. The error correction circuit 400 may generate the failure detection signal FAIL which is enabled when an error occurs in the internal data ID<1:K> loaded on the input/output line IO during the write operation. The error correction circuit 400 may be realized using a general ECC circuit that corrects an error using an error correction code (ECC).

The refresh control circuit 500 may store the address signal ADD<1:M> for selecting the internal data ID<1:K> in response to the failure detection signal FAIL during the read operation. The refresh control circuit 500 may store the address signal ADD<1:M> for selecting the internal data ID<1:K> in response to the failure detection signal FAIL during the write operation. The refresh control circuit 500 may generate the refresh address signal REF_ADD<1:M> for sequentially activating the multiple word lines based on the refresh signal REF. During the refresh operation, when the refresh signal REF is input by a first predetermined number of times, the refresh control circuit 500 may generate the refresh address signal REF_ADD<1:M> for activating a word line connected to at least one memory cell storing the internal data ID<1:K> having an erroneous data, from the address signal ADD<1:M>. A case that the refresh signal REF is input by the first predetermined number of times may be set as a case that the refresh signal REF is input two times or more. The first predetermined number of times may be set as a case that the refresh signal REF is successively input in various ways according to embodiments.

The semiconductor device 20 may be synchronized with the clock signal CLK to generate the data DATA<1:K> from the internal data ID<1:K> stored therein and to output the data DATA<1:K> to the controller 10 during the read operation. The semiconductor device 20 may receive the data DATA<1:K> from the controller 10 in synchronization with the clock signal CLK to generate and store the internal data ID<1:K> during the write operation. The semiconductor device 20 may sequentially activate the multiple word lines based on the refresh address signal REF_ADD<1:M> during the refresh operation. During the refresh operation, when the refresh signal REF is generated by the first predetermined number of times, the semiconductor device 20 may additionally activate a word line connected to at least one memory cell storing the internal data ID<1:K> including an erroneous data.

Figure 3:
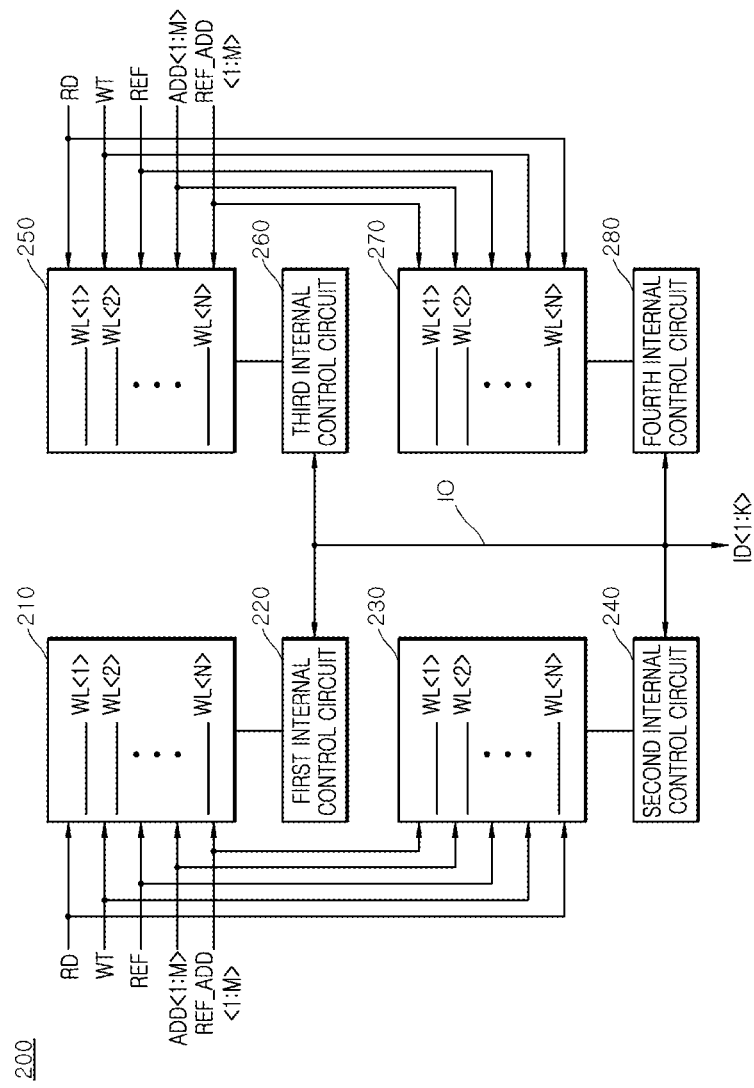
FIG. 3 is a block diagram illustrating a configuration of a core circuit included in the semiconductor device illustrated in FIG. 2.

FIG. 3 is a block diagram illustrating a configuration of the core circuit 200. As illustrated in FIG. 3, the core circuit 200 may include a first memory region 210, a first internal control circuit 220, a second memory region 230, a second internal control circuit 240, a third memory region 250, a third internal control circuit 260, a fourth memory region 270, and a fourth internal control circuit 280.

The first memory region 210 may include first to Nth word lines WL<1:N>. When the read signal RD is input to the first memory region 210, the first memory region 210 may output the internal data ID<1:K> stored in memory cells connected to the word line, which is activated by the address signal ADD<1:M>, among the first to Nth word lines WL<1:N>. When the write signal WT is input to the first memory region 210, the first memory region 210 may store the internal data ID<1:K> into memory cells connected to the word line, which is activated by the address signal ADD<1:M>, among the first to Nth word lines WL<1:N>. When the refresh signal REF is input to the first memory region 210, the first memory region 210 may activate one or more word lines among the first to Nth word lines WL<1:N> based on the refresh address signal REF_ADD<1:M>.

The first internal control circuit 220 may be electrically connected to the first memory region 210. The first internal control circuit 220 may output the internal data ID<1:K> read out of the first memory region 210 through the input/output line IO during the read operation. The first internal control circuit 220 may output the internal data ID<1:K> loaded on the input/output line IO to the first memory region 210 during the write operation. The first internal control circuit 220 may be realized using a general differential amplification circuit that senses and amplifies the internal data ID<1:K>.

The second memory region 230 may also include first to Nth word lines WL<1:N>. When the read signal RD is input to second memory region 230, the second memory region 230 may output the internal data ID<1:K> stored in memory cells connected to the word line, which is activated by the address signal ADD<1:M>, among the first to Nth word lines WL<1:N>. When the write signal WT is input to the second memory region 230, the second memory region 230 may store the internal data ID<1:K> into memory cells connected to the word line, which is activated by the address signal ADD<1:M>, among the first to Nth word lines WL<1:N>. When the refresh signal REF is input to the second memory region 230, the second memory region 230 may activate any one or more word lines among the first to Nth word lines WL<1:N> based on the refresh address signal REF_ADD<1: M>.

The second internal control circuit 240 may be electrically connected to the second memory region 230. The second internal control circuit 240 may output the internal data ID<1:K> read out of the second memory region 230 through the input/output line JO during the read operation. The second internal control circuit 240 may output the internal data ID<1:K> loaded on the input/output line JO to the second memory region 230 during the write operation. The second internal control circuit 240 may be realized using a general differential amplification circuit that senses and amplifies the internal data ID<1: K>.

The third memory region 250 may also include first to Nth word lines WL<1:N>. When the read signal RD is input to the third memory region 250, the third memory region 250 may output the internal data ID<1:K> stored in memory cells connected to the word line, which is activated by the address signal ADD<1:M>, among the first to Nth word lines WL<1:N>. When the write signal WT is input to the third memory region 250, the third memory region 250 may store the internal data ID<1:K> into memory cells connected to the word line, which is activated by the address signal ADD<1:M>, among the first to Nth word lines WL<1:N>. When the refresh signal REF is input to the third memory region 250, the third memory region 250 may activate any one or more word lines among the first to Nth word lines WL<1:N> based on the refresh address signal REF_ADD<1:M>.

The third internal control circuit 260 may be electrically connected to the third memory region 250. The third internal control circuit 260 may output the internal data ID<1:K> read out of the third memory region 250 through the input/output line JO during the read operation. The third internal control circuit 260 may output the internal data ID<1:K> loaded on the input/output line JO to the third memory region 250 during the write operation. The third internal control circuit 260 may be realized using a general differential amplification circuit that senses and amplifies the internal data ID<1:K>.

The fourth memory region 270 may also include first to Nth word lines WL<1:N>. When the read signal RD is input to the fourth memory region 270, the fourth memory region 270 may output the internal data ID<1:K> stored in memory cells connected to the word line, which is activated by the address signal ADD<1:M>, among the first to Nth word lines WL<1:N>. When the write signal WT is input to the fourth memory region 270, the fourth memory region 270 may store the internal data ID<1:K> into memory cells connected to the word line, which is activated by the address signal ADD<1:M>, among the first to Nth word lines WL<1:N>. When the refresh signal REF is input to the fourth memory region 270, the fourth memory region 270 may activate any one or more word lines among the first to Nth word lines WL<1:N> based on the refresh address signals REF_ADD<1:M>.

The fourth internal control circuit 280 may be electrically connected to the fourth memory region 270. The fourth internal control circuit 280 may output the internal data ID<1:K> read out of the fourth memory region 270 through the input/output line IO during the read operation. The fourth internal control circuit 280 may output the internal data ID<1:K> loaded on the input/output line IO to the fourth memory region 270 during the write operation. The fourth internal control circuit 280 may be realized using a general differential amplification circuit that senses and amplifies the internal data ID<1:K>.

Figure 4:
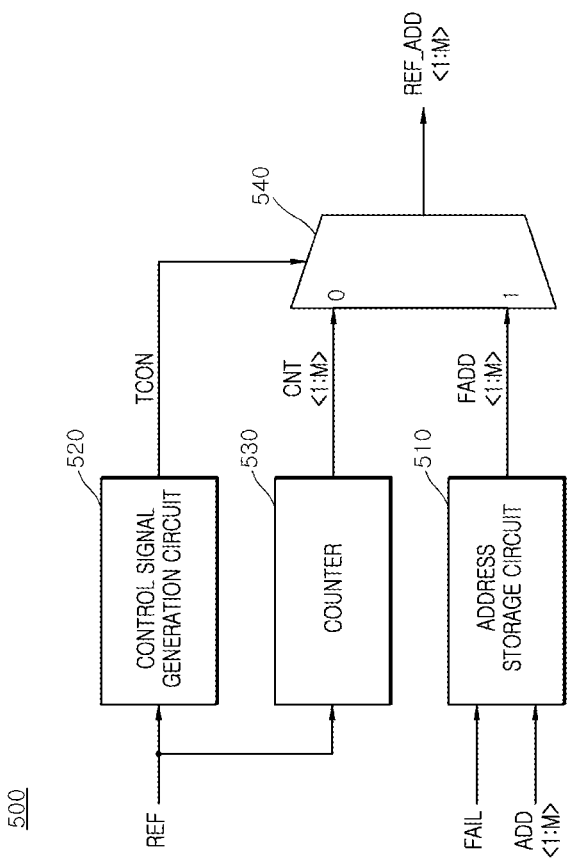
FIG. 4 is a block diagram illustrating a configuration of a refresh control circuit included in the semiconductor device illustrated in FIG. 2.

FIG. 4 is a block diagram illustrating a configuration of the refresh control circuit 500. As illustrated in FIG. 4, the refresh control circuit 500 may include an address storage circuit 510, a control signal generation circuit 520, a counter 530, and a selection transmission circuit 540.

The address storage circuit 510 may store the address signal ADD<1:M> based on the failure detection signal FAIL. The address storage circuit 510 may store the address signal ADD<1:M> input at a point in time when the failure detection signal FAIL is enabled. The address storage circuit 510 may output the address signal ADD<1:M> stored at the point in time when the failure detection signal FAIL is enabled, as failure address signal FADD<1:M>.

The control signal generation circuit 520 may generate a control signal TCON based on the refresh signal REF. The control signal generation circuit 520 may generate the control signal TCON that is enabled when the refresh signal REF is input by the first predetermined number of times. The control signal generation circuit 520 may generate the control signal TCON that is enabled to have a logic "high" level when the refresh signal REF is successively input twice or more.

The counter 530 may generate a counting signal CNT<1:M> based on the refresh signal REF. The counter 530 may generate the counting signal CNT<1:M> sequentially counted when the refresh signal REF is input to the counter 530.

The selection transmission circuit 540 may generate the refresh address signal REF_ADD<1:M> from either the failure address signal FADD<1:M> or the counting signal CNT<1:M> based on the control signal TCON. When the control signal TCON is disabled to have a logic "low" level, the selection transmission circuit 540 may output the counting signal CNT<1:M> as the refresh address signal REF_ADD<1:M>. When the control signal TCON is enabled to a logic "high" level, the selection transmission circuit 540 may output the failure address signal FADD<1:M> as the refresh address signal REF_ADD<1:M>.

An error correction method of the semiconductor system according to an embodiment of the present disclosure will be described hereinafter with reference to FIG. 5.

Figure 5:
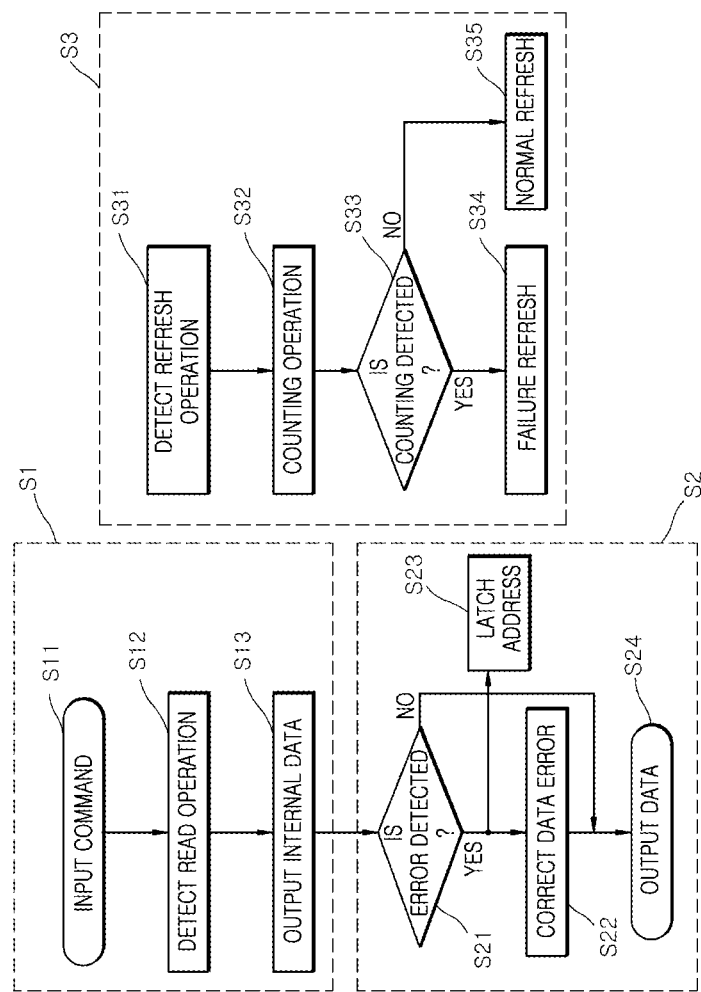
FIG. 5 is a flowchart illustrating an error correction method of the semiconductor system according to an embodiment of the present disclosure.

Referring to FIG. 5, the error correction method may include a read operation step S1, an error correction step S2, and a refresh step S3.

The read operation step S1 may include a command input step S11, a read operation detection step S12, and an internal data output step S13.

The command input step S11 may correspond to a step of transmitting the clock signal CLK, the command signal CMD, and the address signal ADD<1:M> for performing the read operation from the controller 10 to the semiconductor device 20.

The read operation detection step S12 may correspond to a step of generating the read signal RD based on the clock signal CLK and the command signal CMD output from the controller 10.

The internal data output step S13 may correspond to a step of outputting the internal data ID<1:K> stored in the core circuit 200 to the input/output line JO based on the read signal RD and the address signal ADD<1:M>.

The error correction step S2 may include an error detection step S21, a data error correction step S22, an address latching step S23, and a data output step S24.

The error detection step S21 may correspond to a step of detecting an error of the internal data ID<1:K> loaded on the input/output line JO by using the error correction circuit 400. When an error is detected from the internal data ID<1:K> at the error detection step S21 (YES), the error correction circuit 400 may generate the failure detection signal FAIL. The refresh control circuit 500 may store the address signal ADD<1:M> based on the failure detection signal FAIL. When no error is detected from the internal data ID<1:K> at the error detection step S21 (NO), the data output step S24 may be performed.

The data error correction step S22 may correspond to a step of correcting an error of the failed internal data ID<1:K> using an error correction code (ECC) in the error correction circuit 400.

The address latching step S23 may correspond to a step of storing the address signal ADD<1:M> as failure address signal FADD<1:M> in the refresh control circuit 500 when the failure detection signal FAIL is enabled.

The data output step S24 may correspond to a step of generating the data DATA<1:K> by buffering the internal data ID<1:K>, which is corrected at the data error correction step S22, in the data input/output circuit 300. The data output step S24 may also correspond to a step of outputting the data DATA<1:K> generated by the data input/output circuit 300 to the controller 10.

The refresh step S3 may include a refresh operation detection step S31, a counting operation step S32, a counting detection step S33, a failure refresh step S34, and a normal refresh step S35.

The refresh operation detection step S31 may correspond to a step of generating the refresh signal REF based on the clock signal CLK and the command signal CMD output from the controller 10.

The counting operation step S32 may correspond to a step of detecting the refresh signal REF whenever the refresh signal REF is input to the refresh control circuit 500.

The counting detection step S33 may correspond to a step of detecting whether the refresh signal REF is input to the refresh control circuit 500 by the first predetermined number of times.

When the refresh signal REF is input to the refresh control circuit 500 by the first predetermined number of times at the counting detection step S33 (YES), the failure refresh step S34 may be performed.

When the refresh signal REF is input to the refresh control circuit 500 by the number of times less than the first predetermined number of times at the counting detection step S33 (NO), the normal refresh step S35 may be performed.

The failure refresh step S34 may correspond to a step of generating the refresh address signal REF_ADD<1:M> for activating a word line, which is connected to memory cells storing the internal data ID<1:K> including an error, from the address signal ADD<1:M> in the refresh control circuit 500. The failure refresh step S34 may correspond to a step of performing the refresh operation by additionally activating the word line connected to memory cells storing the internal data ID<1:K> including an error based on the refresh address signal REF_ADD<1:M> in the core circuit 200.

The normal refresh step S35 may correspond to a step of generating the refresh address signal REF_ADD<1:M> in the refresh control circuit 500 to sequentially activate the multiple word lines in the core circuit 200. The normal refresh step S35 may correspond to a step of performing the refresh operation by sequentially activating the multiple word lines in the core circuit 200 based on the refresh signal REF and the refresh address signal REF_ADD<1: M> sequentially counted.

The semiconductor system 1 having the afore mentioned configuration may exhibit the reliability of internal data by additionally refreshing memory cells storing failed internal data when the refresh signal is repeatedly input by the first predetermined number of times during the refresh operation.

Figure 6:
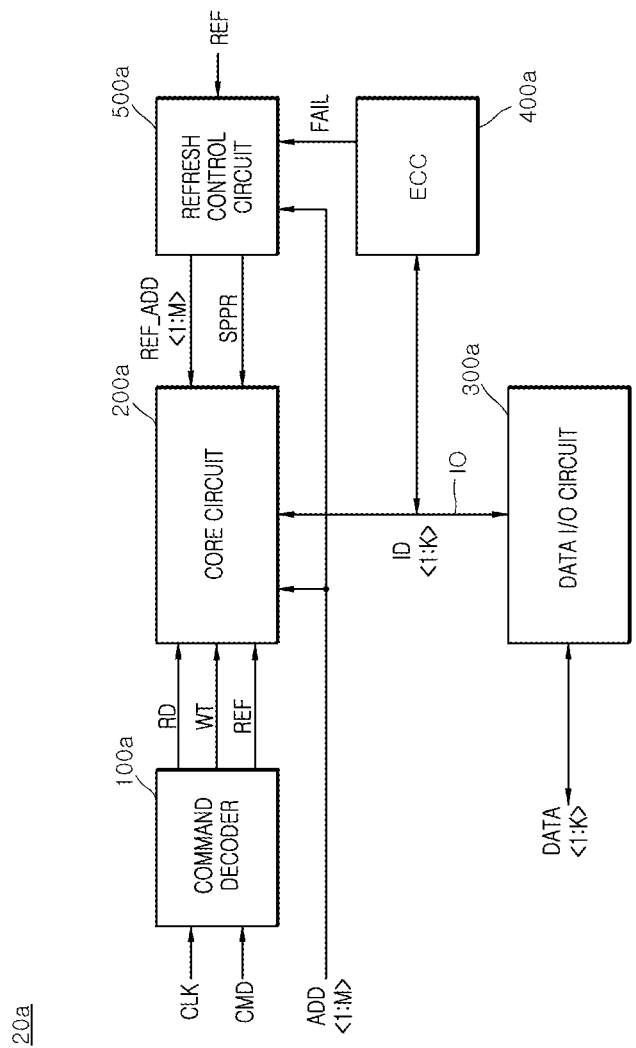
FIG. 6 is a block diagram illustrating a configuration of a semiconductor device according to another embodiment of the present disclosure.

FIG. 6 is a block diagram illustrating a configuration of a semiconductor device 20a corresponding to another example of the semiconductor device 20 illustrated in FIG. 2. As illustrated in FIG. 6, the semiconductor device 20a may include a command decoder 100a, a core circuit 200a, a data input/output circuit 300a, an error correction circuit 400a, and a refresh control circuit 500a.

The command decoder 100a may be synchronized with a clock signal CLK to generate a read signal RD, a write signal WT, and a refresh signal REF, one of which is selectively enabled, from a command signal CMD. The command decoder 100a may decode the command signal CMD in synchronization with the clock signal CLK to generate the read signal RD for performing a read operation. The command decoder 100a may decode the command signal CMD in synchronization with the clock signal CLK to generate the write signal WT for performing a write operation. The command decoder 100a may decode the command signal CMD in synchronization with the clock signal CLK to generate the refresh signal REF for performing a refresh operation.

The core circuit 200a may output internal data ID<1:K> stored therein based on the read signal RD and the address signal ADD<1:M> during the read operation. The core circuit 200a may store the internal data ID<1:K> based on the write signal WT and the address signal ADD<1:M> during the write operation. The core circuit 200 may activate multiple word lines based on the refresh signal REF and the refresh address signal REF_ADD<1:M> during the refresh operation. The core circuit 200a may perform a repair operation for replacing a word line connected memory cells storing the failed internal data ID<1:K> including erroneous data with a repair line, based on a repair signal SPPR during the refresh operation. The internal data ID<1:K> stored in the core circuit 200a may be output through an input/output line JO during the read operation. The internal data ID<1:K> may be input to the core circuit 200a through the input/output line JO during the write operation.

The data input/output circuit 300a may buffer the internal data ID<1:K> loaded on the input/output line IO to generate data DATA<1:K> during the read operation. The data input/output circuit 300a may output the data DATA<1:K> to the controller 10 during the read operation. The data input/output circuit 300a may buffer the data DATA<1:K> to generate the internal data ID<1:K> during the write operation. The data input/output circuit 300a may output the internal data ID<1:K> to the input/output line IO during the write operation. Although FIG. 6 illustrates the input/output line IO with a single line, the input/output line IO may be configured to include multiple lines.

The error correction circuit 400a may detect an error of the internal data ID<1:K> loaded on the input/output line IO during the read operation. The error correction circuit 400a may correct the error of the internal data ID<1:K> during the read operation and may output the corrected data of the internal data ID<1:K> to the input/output line IO. The error correction circuit 400a may generate a failure detection signal FAIL that is enabled when an error exists in the internal data ID<1:K> loaded on the input/output line IO during the read operation. The error correction circuit 400a may detect an error of the internal data ID<1:K> loaded on the input/output line IO during the write operation. The error correction circuit 400a may correct the error of the internal data ID<1:K> during the write operation and may output the corrected data of the internal data ID<1:K> to the input/output line IO. The error correction circuit 400a may generate the failure detection signal FAIL that is enabled when an error exists in the internal data ID<1:K> loaded on the input/output line IO during the write operation. The error correction circuit 400a may be realized using a general ECC circuit that corrects an error using an error correction code (ECC).

The refresh control circuit 500a may store the address signal ADD<1:M> for selecting the internal data ID<1:K> in response to the failure detection signal FAIL during the read operation. The refresh control circuit 500a may store the address signal ADD<1:M> for selecting the internal data ID<1:K> in response to the failure detection signal FAIL during the write operation. The refresh control circuit 500a may generate the refresh address signal REF_ADD<1:M> for activating a word line connected to memory cells storing the failed internal data ID<1:K> including erroneous data from the address signal ADD<1:M>, when the refresh signal REF is input to the refresh control circuit 500a by a first predetermined number of times during the refresh operation. The refresh control circuit 500a may regenerate the refresh address signal REF_ADD<1:M> for activating the word line connected to the memory cells storing the internal data ID<1:K> including the erroneous data, when the address signal ADD<1:M> for selecting the word line connected to the memory cells storing the internal data ID<1:K> including the erroneous data are input to the refresh control circuit 500a by a second predetermined number of times during the refresh operation. The refresh control circuit 500a may generate the repair signal SPPR that is enabled when the internal data ID<1:K> including the erroneous data are input to the refresh control circuit 500a by a third predetermined number of times. A case that the refresh signal REF is input by the first predetermined number of times may be set as a case that the refresh signal REF is input twice or more. The first predetermined number of times may correspond to the number of times that the refresh signal REF is successively input. A case that the address signal ADD<1:M> are input by the second predetermined number of times may be set as a case that the address signal ADD<1:M> having a logic level combination for selecting the internal data ID<1:K> including erroneous data are input twice. The second predetermined number of times may correspond to the number of times that the address signal ADD<1:M> having the same logic level combination are successively input. A case that the internal data ID<1:K> including erroneous data are input by the third predetermined number of times may be set as a case that the address signal ADD<1:M> having a logic level combination for selecting the internal data ID<1:K> having erroneous data are input at last three times.

The semiconductor device 20a having the aforementioned configuration may generate the data DATA<1:K> from the internal data ID<1:K> stored therein in synchronization with the clock signal CLK during the read operation and may output the data DATA<1:K> to the controller 10. The semiconductor device 20a may receive the data DATA<1:K> from the controller 10 in synchronization with the clock signal CLK to generate the internal data ID<1:K> from the data DATA<1:K> and to store the internal data ID<1:K> therein during the write operation. The semiconductor device 20a may sequentially activate multiple word lines in the core circuit 200a based on the refresh address signal REF_ADD<1:M> during the refresh operation. The semiconductor device 20a may reactivate a word line connected to memory cells storing the internal data ID<1:K> including erroneous data when the refresh signal REF is generated by the first predetermined number of times during the refresh operation. The semiconductor device 20a may reactivate a word line connected to memory cells storing the internal data ID<1:K> including erroneous data when the address signal ADD<1:M> having a logic level combination for selecting the internal data ID<1:K> including the erroneous data are input twice during the refresh operation. When the address signal ADD<1:M> having a logic level combination for selecting the internal data ID<1:K> including erroneous data are input three times or more during the refresh operation, the semiconductor device 20a may replace a word line connected to memory cells storing the internal data ID<1:K> including erroneous data with a repair line.

Figure 7:
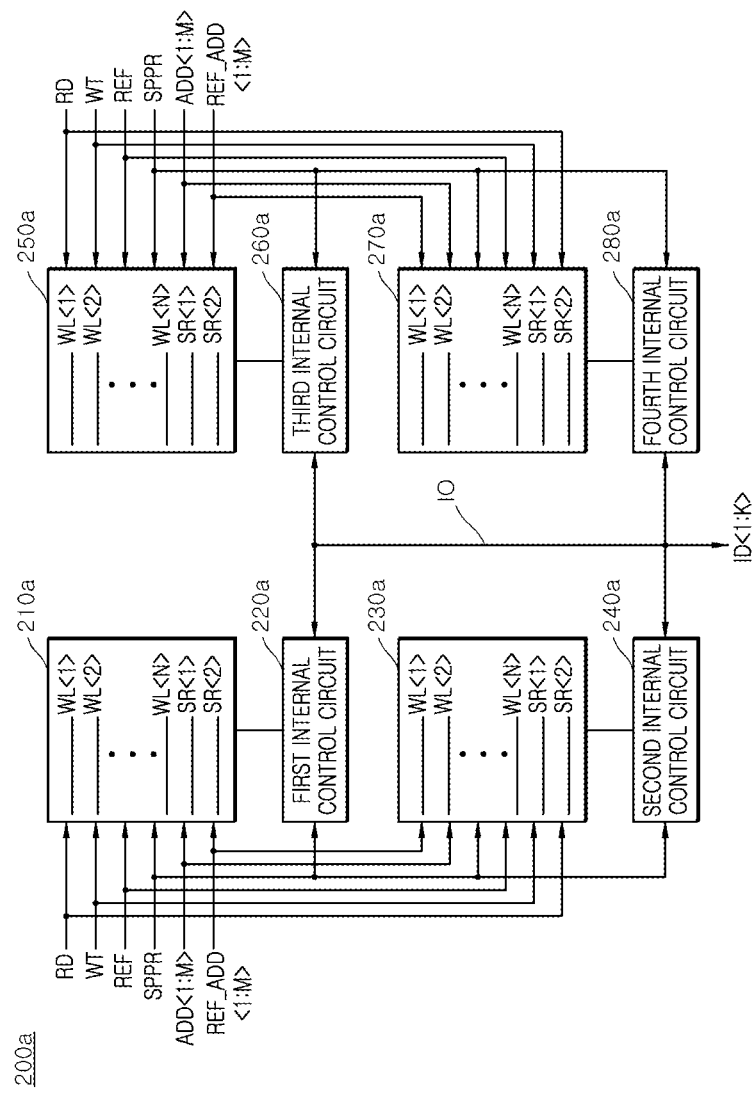
FIG. 7 is a block diagram illustrating a configuration of a core circuit included in the semiconductor device illustrated in FIG. 6.

FIG. 7 is a block diagram illustrating a configuration of the core circuit 200a. As illustrated in FIG. 7, the core circuit 200a may include a first memory region 210a, a first internal control circuit 220a, a second memory region 230a, a second internal control circuit 240a, a third memory region 250a, a third internal control circuit 260a, a fourth memory region 270a, and a fourth internal control circuit 280a.

The first memory region 210a may include first to Nth word lines WL<1:N> and first and second repair lines SR<1:2>. When the read signal RD is input to the first memory region 210a, the first memory region 210a may output the internal data ID<1:K> stored in memory cells connected to the word line, which is activated by the address signal ADD<1:M>, among the first to Nth word lines WL<1:N>. When the write signal WT is input to the first memory region 210a, the first memory region 210a may store the internal data ID<1:K> into memory cells connected to the word line, which is activated by the address signal ADD<1:M>, among the first to Nth word lines WL<1:N>. When the refresh signal REF is input to the first memory region 210a, the first memory region 210a may activate any one or more word lines among the first to Nth word lines WL<1:N> based on the refresh address signal REF_ADD<1:M>. When the repair signal SPPR is input to the first memory region 210a, the first memory region 210a may replace a failed word line, which is selected by the refresh address signal REF_ADD<1:M>, among the first to Nth word lines WL<1:N>, with any one of the first and second repair lines SR<1:2>.

The first internal control circuit 220a may be electrically connected to the first memory region 210a. The first internal control circuit 220a may output the internal data ID<1:K> read out of the first memory region 210a through the input/output line JO during the read operation. The first internal control circuit 220a may output the internal data ID<1:K> loaded on the input/output line JO to the first memory region 210a during the write operation. The first internal control circuit 220a may be realized using a general differential amplification circuit that senses and amplifies the internal data ID<1:K>. When the repair signal SPPR is input to the first internal control circuit 220a, the first internal control circuit 220a may control the first memory region 210a to replace a failed word line, which is selected by the refresh address signal REF_ADD<1:M>, among the first to Nth word lines WL<1:N> with any one of the first and second repair lines SR<1:2>. When the repair signal SPPR is input to the first internal control circuit 220a, the first internal control circuit 220a may copy the internal data ID<1:K> and may control the first memory region 210a to store the copied internal data ID<1:K> into the first and second repair lines SR<1:2>.

The second memory region 230a may also include first to Nth word lines WL<1:N> and first and second repair lines SR<1:2>. When the read signal RD is input to the second memory region 230a, the second memory region 230a may output the internal data ID<1:K> stored in memory cells connected to the word line, which is activated by the address signal ADD<1:M>, among the first to Nth word lines WL<1:N>. When the write signal WT is input to the second memory region 230a, the second memory region 230a may store the internal data ID<1:K> into memory cells connected to the word line, which is activated by the address signal ADD<1:M>, among the first to Nth word lines WL<1:N>. When the refresh signal REF is input to the second memory region 230a, the second memory region 230a may activate one or more word lines among the first to Nth word lines WL<1:N> based on the refresh address signal REF_ADD<1:M>. When the repair signal SPPR is input to the second memory region 230a, the second memory region 230a may replace a failed word line, which is selected by the refresh address signal REF_ADD<1:M>, among the first to Nth word lines WL<1:N> with any one of the first and second repair lines SR<1:2>.

The second internal control circuit 240a may be electrically connected to the second memory region 230a. The second internal control circuit 240a may output the internal data ID<1:K> read out of the second memory region 230a through the input/output line JO during the read operation. The second internal control circuit 240a may output the internal data ID<1:K> loaded on the input/output line JO to the second memory region 230a during the write operation. The second internal control circuit 240a may be realized using a general differential amplification circuit that senses and amplifies the internal data ID<1:K>. When the repair signal SPPR is input to the second internal control circuit 240a, the second internal control circuit 240a may control the second memory region 230a to replace a failed word line, which is selected by the refresh address signal REF_ADD<1:M>, among the first to Nth word lines WL<1:N> with any one of the first and second repair lines SR<1:2>. When the repair signal SPPR is input to the second internal control circuit 240a, the second internal control circuit 240a may copy the internal data ID<1:K> and may control the second memory region 230a to store the copied internal data ID<1:K> into the first and second repair lines SR<1:2>.

The third memory region 250a may also include first to Nth word lines WL<1:N> and first and second repair lines SR<1:2>. When the read signal RD is input to the third memory region 250a, the third memory region 250a may output the internal data ID<1:K> stored in memory cells connected to the word line, which is activated by the address signal ADD<1:M>, among the first to Nth word lines WL<1:N>. When the write signal WT is input to the third memory region 250a, the third memory region 250a may store the internal data ID<1:K> into memory cells connected to the word line, which is activated by the address signal ADD<1:M>, among the first to Nth word lines WL<1:N>. When the refresh signal REF is input to the third memory region 250a, the third memory region 250a may activate one or more word lines among the first to Nth word lines WL<1:N> based on the refresh address signal REF_ADD<1:M>. When the repair signal SPPR is input to the third memory region 250a, the third memory region 250a may replace a failed word line, which is selected by the refresh address signal REF_ADD<1:M>, among the first to Nth word lines WL<1:N> with any one of the first and second repair lines SR<1:2>.

The third internal control circuit 260a may be electrically connected to the third memory region 250a. The third internal control circuit 260a may output the internal data ID<1:K> read out of the third memory region 250a through the input/output line JO during the read operation. The third internal control circuit 260a may output the internal data ID<1:K> loaded on the input/output line JO to the third memory region 250a during the write operation. The third internal control circuit 260a may be realized using a general differential amplification circuit that senses and amplifies the internal data ID<1:K>. When the repair signal SPPR is input to the third internal control circuit 260a, the third internal control circuit 260a may control the third memory region 250a to replace a failed word line, which is selected by the refresh address signal REF_ADD<1:M>, among the first to Nth word lines WL<1:N> with any one of the first and second repair lines SR<1:2>. When the repair signal SPPR is input to the third internal control circuit 260a, the third internal control circuit 260a may copy the internal data ID<1:K> and may control the third memory region 250a to store the copied internal data ID<1:K> into the first and second repair lines SR<1:2>.

The fourth memory region 270a may also include first to Nth word lines WL<1:N> and first and second repair lines SR<1:2>. When the read signal RD is input to the fourth memory region 270a, the fourth memory region 270a may output the internal data ID<1:K> stored in memory cells connected to the word line, which is activated by the address signal ADD<1:M> among the first to Nth word lines WL<1:N>. When the write signal WT is input to the fourth memory region 270a, the fourth memory region 270a may store the internal data ID<1:K> into memory cells connected to the word line, which is activated by the address signal ADD<1:M>, among the first to Nth word lines WL<1:N>. When the refresh signal REF is input to the fourth memory region 270a, the fourth memory region 270a may activate one or more word lines among the first to Nth word lines WL<1:N> based on the refresh address signal REF_ADD<1:M>. When the repair signal SPPR is input to the fourth memory region 270a, the fourth memory region 270a may replace a failed word line, which is selected by the refresh address signal REF_ADD<1:M>, among the first to Nth word lines WL<1:N> with any one of the first and second repair lines SR<1:2>.

The fourth internal control circuit 280a may be electrically connected to the fourth memory region 270a. The fourth internal control circuit 280a may output the internal data ID<1:K> read out of the fourth memory region 270a through the input/output line IO during the read operation. The fourth internal control circuit 280a may output the internal data ID<1:K> loaded on the input/output line IO to the fourth memory region 270a during the write operation. The fourth internal control circuit 280a may be realized using a general differential amplification circuit that senses and amplifies the internal data ID<1:K>. When the repair signal SPPR is input to the fourth internal control circuit 280a, the fourth internal control circuit 280a may control the fourth memory region 270a to replace a failed word line, which is selected by the refresh address signal REF_ADD<1:M>, among the first to Nth word lines WL<1:N> with any one of the first and second repair lines SR<1:2>. When the repair signal SPPR is input to the fourth internal control circuit 280a, the fourth internal control circuit 280a may copy the internal data ID<1:K> and may control the fourth memory region 270a to store the copied internal data ID<1:K> into the first and second repair lines SR<1:2>.

Figure 8:
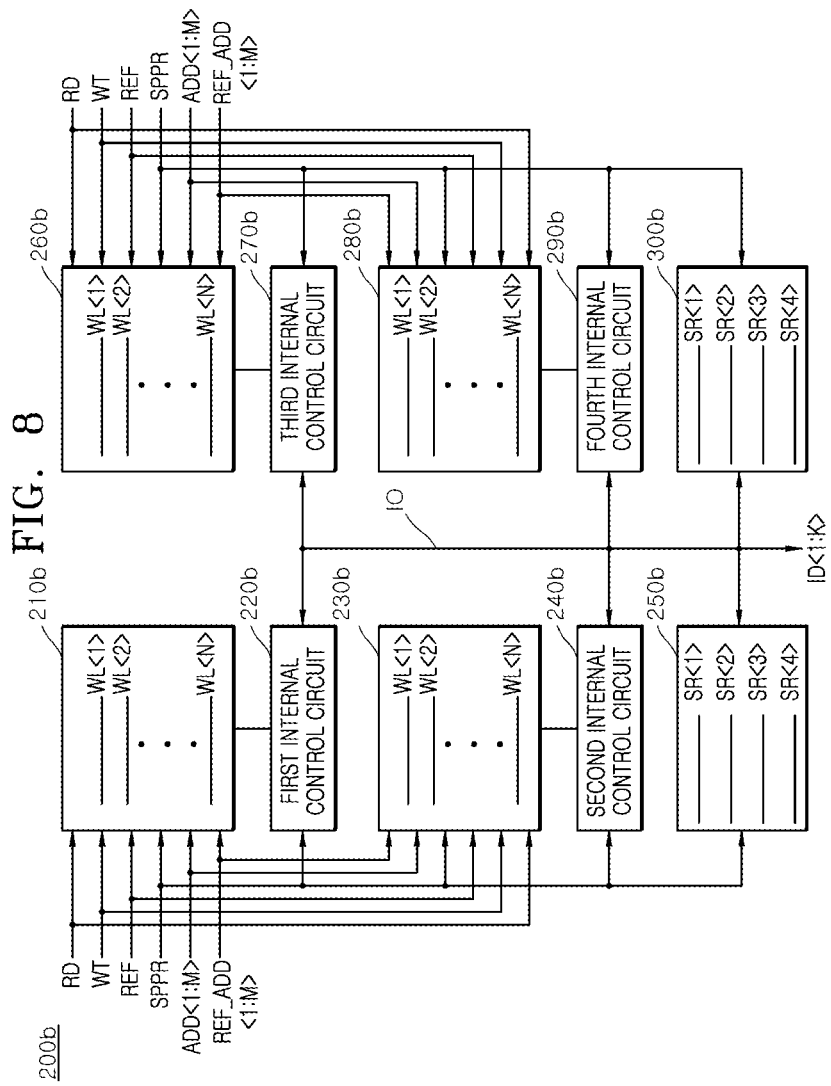
FIG. 8 is a block diagram illustrating another example of the core circuit included in the semiconductor device illustrated in FIG. 6.

FIG. 8 is a block diagram illustrating a configuration of a core circuit 200b corresponding to another example of the core circuit 200a illustrated in FIG. 7. As illustrated in FIG. 8, the core circuit 200b may include a first memory region 210b, a first internal control circuit 220b, a second memory region 230b, a second internal control circuit 240b, a first repair region 250b, a third memory region 260b, a third internal control circuit 270b, a fourth memory region 280b, a fourth internal control circuit 290b, and a second repair region 300b.

The first memory region 210b may include first to Nth word lines WL<1:N>. When the read signal RD is input to the first memory region 210b, the first memory region 210b may output the internal data ID<1:K> stored in memory cells connected to the word line, which is activated by the address signal ADD<1:M>, among the first to Nth word lines WL<1:N>. When the write signal WT is input to the first memory region 210b, the first memory region 210b may store the internal data ID<1:K> into memory cells connected to the word line, which is activated by the address signal ADD<1:M>, among the first to Nth word lines WL<1:N>. When the refresh signal REF is input to the first memory region 210b, the first memory region 210b may activate one or more word lines among the first to Nth word lines WL<1:N> based on the refresh address signal REF_ADD<1:M>. When the repair signal SPPR is input to the first memory region 210b, the first memory region 210b may replace a failed word line, which is selected by the refresh address signal REF_ADD<1:M>, among the first to Nth word lines WL<1:N> with any one of first and second repair lines SR<1:2> included in the first repair region 250b.

The first internal control circuit 220b may be electrically connected to the first memory region 210b and the first repair region 250b. The first internal control circuit 220b may output the internal data ID<1:K> read out of the first memory region 210b through the input/output line JO during the read operation. The first internal control circuit 220b may output the internal data ID<1:K> loaded on the input/output line JO to the first memory region 210b during the write operation. The first internal control circuit 220b may be realized using a general differential amplification circuit that senses and amplifies the internal data ID<1:K>. When the repair signal SPPR is input to the first internal control circuit 220b, the first internal control circuit 220b may control the first memory region 210b and the first repair region 250b to replace a failed word line, which is selected by the refresh address signal REF_ADD<1:M>, among the first to Nth word lines WL<1:N> with any one of the first and second repair lines SR<1:2> included in the first repair region 250b. When the repair signal SPPR is input to the first internal control circuit 220b, the first internal control circuit 220b may copy the internal data ID<1:K> and may control the first memory region 210b and the first repair region 250b to store the copied internal data ID<1:K> into the first and second repair lines SR<1:2>.

The second memory region 230b may also include first to Nth word lines WL<1:N>. When the read signal RD is input to the second memory region 230b, the second memory region 230b may output the internal data ID<1:K> stored in memory cells connected to the word line, which is activated by the address signal ADD<1:M>, among the first to Nth word lines WL<1:N>. When the write signal WT is input to the second memory region 230b, the second memory region 230b may store the internal data ID<1:K> into memory cells connected to the word line, which is activated by the address signal ADD<1:M>, among the first to Nth word lines WL<1:N>. When the refresh signal REF is input to the second memory region 230b, the second memory region 230b may activate one or more word lines among the first to Nth word lines WL<1:N> based on the refresh address signal REF_ADD<1:M>. When the repair signal SPPR is input to the second memory region 230b, the second memory region 230b may replace a failed word line, which is selected by the refresh address signal REF_ADD<1:M>, among the first to Nth word lines WL<1:N> with any one of third and fourth repair lines SR<3:4> included in the first repair region 250b.

The second internal control circuit 240b may be electrically connected to the second memory region 230b and the first repair region 250b. The second internal control circuit 240b may output the internal data ID<1:K> read out of the second memory region 230b through the input/output line JO during the read operation. The second internal control circuit 240b may output the internal data ID<1:K> loaded on the input/output line JO to the second memory region 230b during the write operation. The second internal control circuit 240b may be realized using a general differential amplification circuit that senses and amplifies the internal data ID<1:K>. When the repair signal SPPR is input to the second internal control circuit 240b, the second internal control circuit 240b may control the second memory region 230b and the first repair region 250b to replace a failed word line, which is selected by the refresh address signal REF_ADD<1:M>, among the first to Nth word lines WL<1: N> with any one of the third and fourth repair lines SR<3:4> included in the first repair region 250b. When the repair signal SPPR is input to the second internal control circuit 240b, the second internal control circuit 240b may copy the internal data ID<1:K> and may control the second memory region 230b and the first repair region 250b to store the copied internal data ID<1:K> into the third and fourth repair lines SR<3:4>.

The first repair region 250b may include the first to fourth repair lines SR<1:4>. The first and second repair lines SR<1:2> in the first repair region 250b may be used to replace word lines connected to failed memory cells included in the first memory region 210b. The third and fourth repair lines SR<3:4> in the first repair region 250b may be used to replace word lines connected to failed memory cells included in the second memory region 230b.

The third memory region 260b may also include first to Nth word lines WL<1:N>. When the read signal RD is input to the third memory region 260b, the third memory region 260b may output the internal data ID<1:K> stored in memory cells connected to the word line, which is activated by the address signal ADD<1:M>, among the first to Nth word lines WL<1:N>. When the write signal WT is input to the third memory region 260b, the third memory region 260b may store the internal data ID<1:K> into memory cells connected to the word line, which is activated by the address signal ADD<1:M>, among the first to Nth word lines WL<1:N>. When the refresh signal REF is input to the third memory region 260b, the third memory region 260b may activate one or more word lines among the first to Nth word lines WL<1:N> based on the refresh address signal REF_ADD<1:M>. When the repair signal SPPR is input to the third memory region 260b, the third memory region 260b may replace a failed word line, which is selected by the refresh address signal REF_ADD<1:M>, among the first to Nth word lines WL<1:N> with any one of first and second repair lines SR<1:2> included in the second repair region 300b.

The third internal control circuit 270b may be electrically connected to the third memory region 260b and the second repair region 300b. The third internal control circuit 270b may output the internal data ID<1:K> read out of the third memory region 260b through the input/output line JO during the read operation. The third internal control circuit 270b may output the internal data ID<1:K> loaded on the input/output line JO to the third memory region 260b during the write operation. The third internal control circuit 270b may be realized using a general differential amplification circuit that senses and amplifies the internal data ID<1:K>. When the repair signal SPPR is input to the third internal control circuit 270b, the third internal control circuit 270b may control the third memory region 260b and the second repair region 300b to replace a failed word line, which is selected by the refresh address signal REF_ADD<1:M>, among the first to Nth word lines WL<1:N> with any one of the first and second repair lines SR<1:2> included in the second repair region 300b. When the repair signal SPPR is input to the third internal control circuit 270b, the third internal control circuit 270b may copy the internal data ID<1:K> and may control the third memory region 260b and the second repair region 300b to store the copied internal data ID<1:K> into the first and second repair lines SR<1:2> included in the second repair region 300b.

The fourth memory region 280b may also include first to Nth word lines WL<1:N>. When the read signal RD is input to the fourth memory region 280b, the fourth memory region 280b may output the internal data ID<1:K> stored in memory cells connected to the word line, which is activated by the address signal ADD<1:M> among the first to Nth word lines WL<1:N>. When the write signal WT is input to the fourth memory region 280b, the fourth memory region 280b may store the internal data ID<1:K> into memory cells connected to the word line, which is activated by the address signal ADD<1:M>, among the first to Nth word lines WL<1:N>. When the refresh signal REF is input to the fourth memory region 280b, the fourth memory region 280b may activate one or more word lines among the first to Nth word lines WL<1:N> based on the refresh address signal REF_ADD<1:M>. When the repair signal SPPR is input to the fourth memory region 280b, the fourth memory region 280b may replace a failed word line, which is selected by the refresh address signal REF_ADD<1:M>, among the first to Nth word lines WL<1:N> with any one of third and fourth repair lines SR<3:4> included in the second repair region 300b.

The fourth internal control circuit 290b may be electrically connected to the fourth memory region 280b and the second repair region 300b. The fourth internal control circuit 290b may output the internal data ID<1:K> read out of the fourth memory region 280b through the input/output line JO during the read operation. The fourth internal control circuit 290b may output the internal data ID<1:K> loaded on the input/output line JO to the fourth memory region 280b during the write operation. The fourth internal control circuit 290b may be realized using a general differential amplification circuit that senses and amplifies the internal data ID<1:K>. When the repair signal SPPR is input to the fourth internal control circuit 290b, the fourth internal control circuit 290b may control the fourth memory region 280b and the second repair region 300b to replace a failed word line, which is selected by the refresh address signal REF_ADD<1:M>, among the first to Nth word lines WL<1:N> with any one of the third and fourth repair lines SR<3:4> included in the second repair region 300b. When the repair signal SPPR is input to the fourth internal control circuit 290b, the fourth internal control circuit 290b may copy the internal data ID<1:K> and may control the fourth memory region 280b and the second repair region 300b to store the copied internal data ID<1:K> into the third and fourth repair lines SR<3:4> included in the second repair region 300b.

The second repair region 300b may include the first to fourth repair lines SR<1:4>. The first and second repair lines SR<1:2> in the second repair region 300b may be used to replace word lines connected to failed memory cells included in the third memory region 260b. The third and fourth repair lines SR<3:4> in the second repair region 300b may be used to replace word lines connected failed memory cells included in the fourth memory region 280b.

Figure 9:
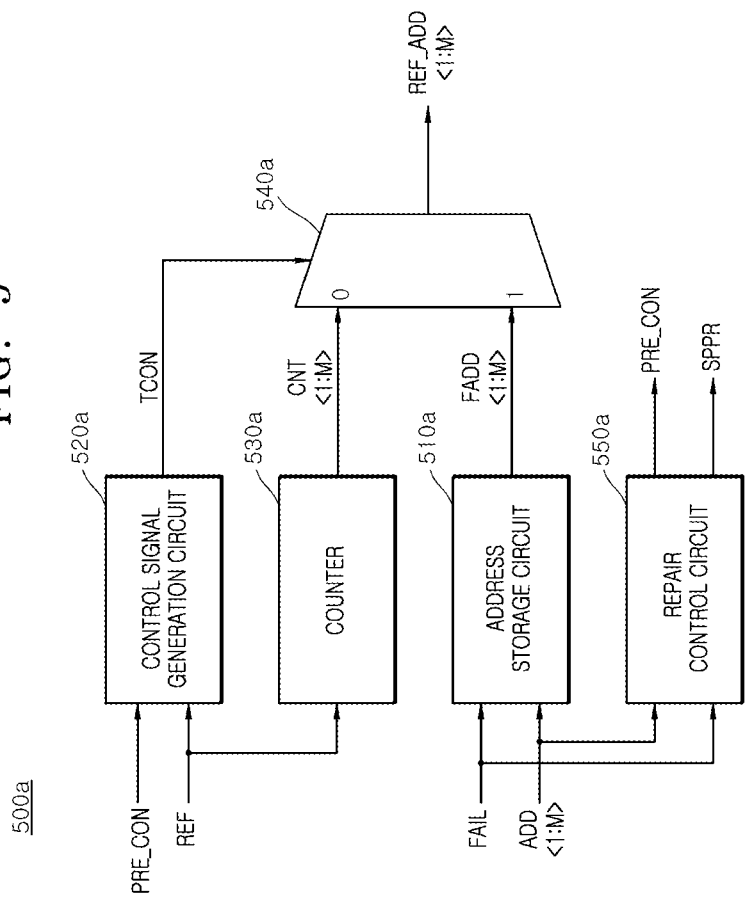
FIG. 9 is a block diagram illustrating a configuration of a refresh control circuit included in the semiconductor device illustrated in FIG. 6.

FIG. 9 is a block diagram illustrating a configuration of a refresh control circuit 500a corresponding to another example of the refresh control circuit 500 illustrated in FIG. 4. As illustrated in FIG. 9, the refresh control circuit 500a may include an address storage circuit 510a, a control signal generation circuit 520a, a counter 530a, a selection transmission circuit 540a, and a repair control circuit 550a.

The address storage circuit 510a may store the address signal ADD<1:M> based on the failure detection signal FAIL. The address storage circuit 510a may store the address signal ADD<1:M> input at a point in time when the failure detection signal FAIL is enabled. The address storage circuit 510a may output the address signal ADD<1:M>, which are stored at the point in time when the failure detection signal FAIL is enabled, as the failure address signal FADD<1:M>.

The control signal generation circuit 520a may generate a control signal TCON based on a pre-control signal PRE_CON and a refresh signal REF. The control signal generation circuit 520a may generate the control signal TCON that is enabled when the pre-control signal PRE_CON is input. The control signal generation circuit 520a may generate the control signal TCON that is enabled to have a logic "high" level when the pre-control signal PRE_CON has a logic "high" level. The control signal generation circuit 520a may generate the control signal TCON that is enabled when the refresh signal REF is input by a first predetermined number of times. For example, the control signal generation circuit 520a may generate the control signal TCON that is enabled to have a logic "high" level when the refresh signal REF is successively input twice or more.

The counter 530a may generate the counting signal CNT<1:M> based on the refresh signal REF. The counter 530a may generate the counting signal CNT<1:M> that are sequentially counted when the refresh signal REF is input.

The selection transmission circuit 540a may generate the refresh address signal REF_ADD<1:M> from the failure address signal FADD<1:M> or the counting signal CNT<1:M> based on the control signal TCON. When the control signal TCON is disabled to have a logic "low" level, the selection transmission circuit 540a may output the counting signal CNT<1:M> as the refresh address signal REF_ADD<1:M>. When the control signal TCON is enabled to have a logic "high" level, the selection transmission circuit 540a may output the failure address signal FADD<1:M> as the refresh address signal REF_ADD<1:M>.

The repair control circuit 550a may generate the pre-control signal PRE_CON that is enabled when the address signal ADD<1:M> having the same logic level combination are input by a second predetermined number of times in response to the failure detection signal FAIL. The repair control circuit 550a may generate the repair signal SPPR that is enabled when the address signal ADD<1:M> having the same logic level combination are input by a third predetermined number of times in response to the failure detection signal FAIL.

Figure 10:
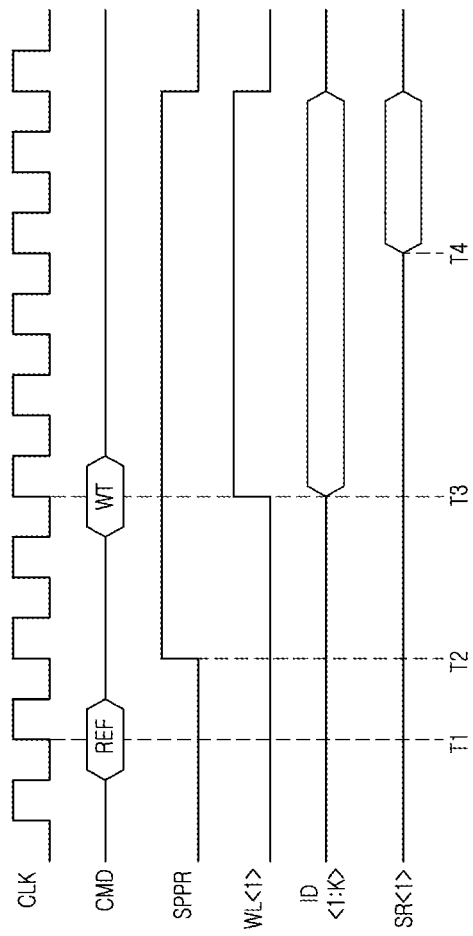
FIGS. 10 and 11 are timing diagrams illustrating an operation of a semiconductor system according to another embodiment of the present disclosure.

A repair operation performed during a refresh operation of the semiconductor device 20a will be described hereinafter with reference to FIG. 10 in conjunction with a case that errors repeatedly occur whenever the first word line WL<1> of the first memory region 210a is selected.

At a point in time T1, the command decoder 100a may be synchronized with the clock signal CLK to generate the refresh signal REF from the command signal CMD.

The address storage circuit 510a may output the address signal ADD<1:M>, which are stored at a point in time when the failure detection signal FAIL is enabled, as the failure address signal FADD<1:M>.

At a point in time T2, the repair control circuit 550a may generate the repair signal SPPR that is enabled to have a logic "high" level because the address signal ADD<1:M> having the same logic level combination are input by the third predetermined number of times in response to the failure detection signal FAIL.

The control signal generation circuit 520a may generate the control signal TCON that is enabled to have a logic "high" level based on the refresh signal REF.

The selection transmission circuit 540a may output the failure address signal FADD<1:M> as the refresh address signal REF_ADD<1:M> based on the control signal TCON having a logic "high" level.

At a point in time T3, the command decoder 100a may generate the write signal WT from the command signal CMD in synchronization with the clock signal CLK.

The first internal control circuit 220a may output the internal data ID<1:K> loaded on the input/output line IO to the first memory region 210a during the write operation. The first internal control circuit 220a may control the first memory region 210a to replace the first word line WL<1> corresponding to a failed word line, which is selected by the refresh address signal REF_ADD<1:M>, with the first repair line SR<1> in response to the repair signal SPPR having a logic "high" level.

At a point in time T4, the first memory region 210a may replace the failed first word line WL<1> with the first repair line SR<1> based on the repair signal SPPR having a logic "high" level and the refresh address signal REF_ADD<1: M>.

The first internal control circuit 220a may copy the internal data ID<1:K> input at the point in time T3 and may store the copied internal data into memory cells connected to the first repair line SR<1>.

As described above, the semiconductor system 1 according to an embodiment of the present disclosure may improve the reliability of internal data by replacing a failed word line connected to failed memory cells with a repair line when an address signal for selecting the failed memory cells storing failed internal data is input by a third predetermined number of times during a refresh operation.

Figure 11:
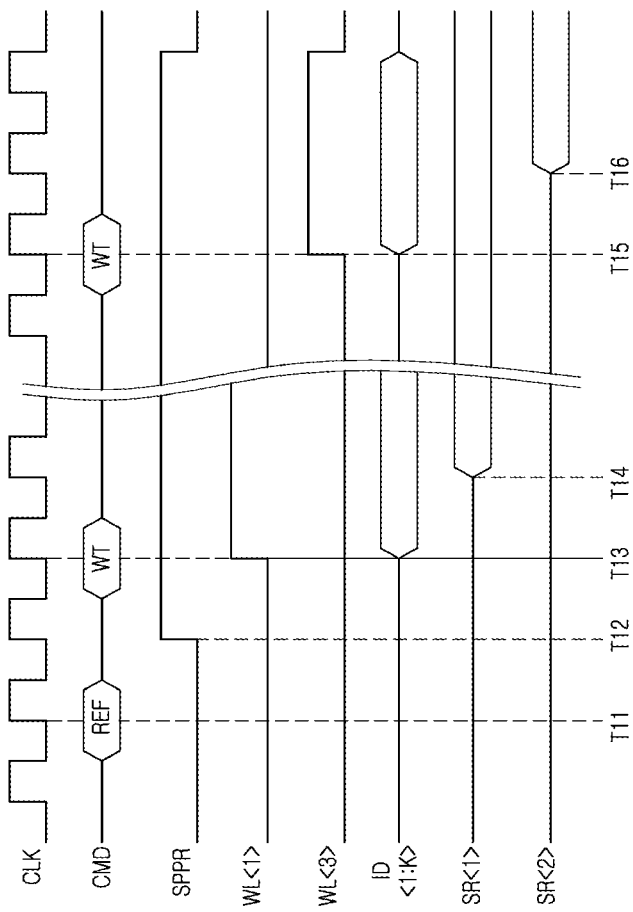

A repair operation performed during a refresh operation of the semiconductor device 20b will be described hereinafter with reference to FIG. 11 in conjunction with a case that errors repeatedly occur whenever the first word line WL<1> of the first memory region 210b and the third word line WL<3> of the second memory region 230b are selected.

At a point in time T11, the command decoder 100a may generate the refresh signal REF from the command signal CMD in synchronization with the clock signal CLK.

The address storage circuit 510a may output the address signal ADD<1:M>, which are stored at a point in time when the failure detection signal FAIL is enabled, as the failure address signal FADD<1:M>.

At a point in time T12, the repair control circuit 550a may generate the repair signal SPPR that is enabled to have a logic "high" level because the address signal ADD<1:M> having the same logic level combination are input by the third predetermined number of times in response to the failure detection signal FAIL.

The control signal generation circuit 520a may generate the control signal TCON that is enabled to have a logic "high" level based on the refresh signal REF.

The selection transmission circuit 540a may output the failure address signal FADD<1:M> as the refresh address signal REF_ADD<1:M> based on the control signal TCON having a logic "high" level.

At a point in time T13, the command decoder 100a may generate the write signal WT from the command signal CMD in synchronization with the clock signal CLK.

The first internal control circuit 220b may output the internal data ID<1:K> loaded on the input/output line IO to the first memory region 210b during the write operation. The first internal control circuit 220b may control the first memory region 210b to replace the failed first word line WL<1>, which is selected by the refresh address signal REF_ADD<1:M>, with the first repair line SR<1> in response to the repair signal SPPR having a logic "high" level.

At a point in time T14, the first memory region 210b may replace the failed first word line WL<1> with the first repair line SR<1> based on the repair signal SPPR having a logic "high" level and the refresh address signal REF_ADD<1: M>.

The first internal control circuit 220b may copy the internal data ID<1:K> input at the point in time T13 and may store the copied internal data into memory cells connected to the first repair line SR<1>.

At a point in time T15, the command decoder 100a may generate the write signal WT from the command signal CMD in synchronization with the clock signal CLK.

The second internal control circuit 240b may output the internal data ID<1:K> loaded on the input/output line JO to the second memory region 230b during the write operation.

The second internal control circuit 240b may control the second memory region 230b to replace the failed third word line WL<3> with the second repair line SR<2> based on the repair signal SPPR having a logic "high" level and the refresh address signal REF_ADD<1:M>.

At a point in time T16, the second memory region 230b may replace the failed third word line WL<3> with the second repair line SR<2> based on the repair signal SPPR having a logic "high" level and the refresh address signal REF_ADD<1:M>.

The second internal control circuit 240b may copy the internal data ID<1:K> input at the point in time T15 and may store the copied internal data into memory cells connected to the second repair line SR<2>.

An error correction method of the semiconductor system 1 according to an embodiment of the present disclosure may improve the reliability of internal data by replacing a failed word line connected to failed memory cells with a repair line when an address signal for selecting the failed memory cells storing failed internal data is input by a third predetermined number of times during a refresh operation.

Figure 12:
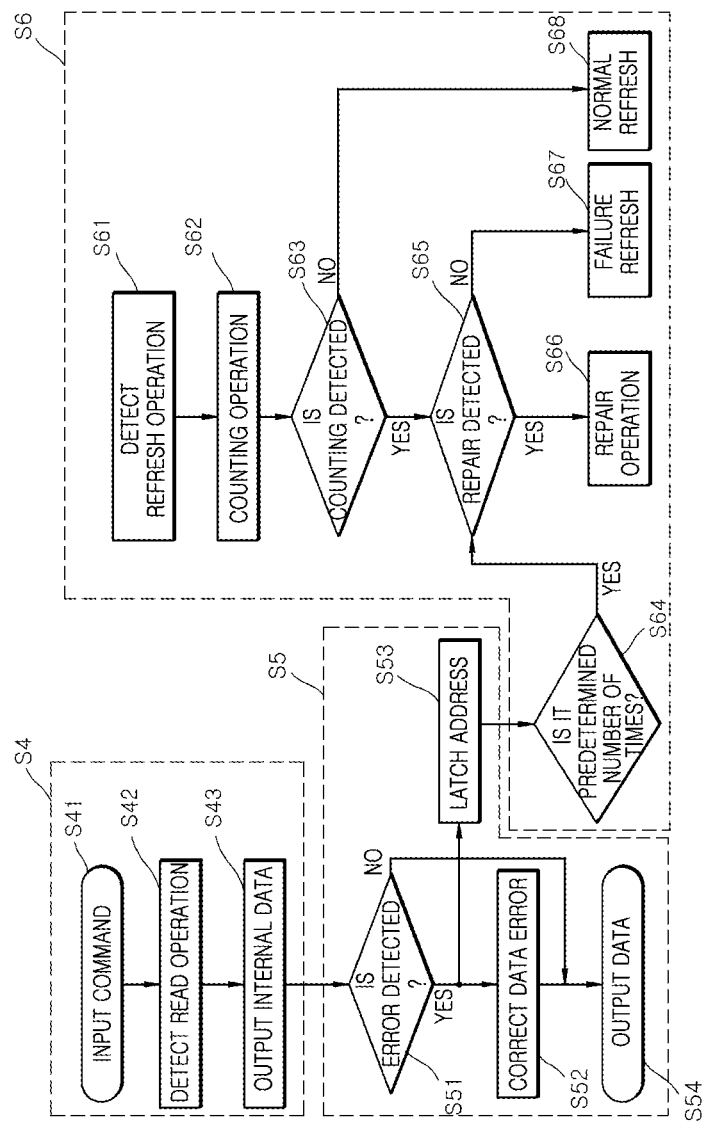
FIG. 12 is a flowchart illustrating an error correction method of a semiconductor system according to another embodiment of the present disclosure.

An error correction method of a semiconductor system according to another embodiment of the present disclosure will be described hereinafter with reference to FIG. 12.

The error correction method may include a read operation step S4, an error correction step S5, and a refresh step S6.

The read operation step S4 may include a command input step S41, a read operation detection step S42, and an internal data output step S43.

The command input step S41 may correspond to a step of transmitting the clock signal CLK, the command signal CMD, and the address signal ADD<1:M> for performing the read operation from the controller 10 to the semiconductor device 20a.

The read operation detection step S42 may correspond to a step of generating the read signal RD based on the clock signal CLK and the command signal CMD output from the controller 10.

The internal data output step S43 may correspond to a step of outputting the internal address signals ID<1:K> stored in the core circuit 200a to the input/output line IO based on the read signal RD and the address signal ADD<1:M>.

The error correction step S5 may include an error detection step S51, a data error correction step S52, an address latching step S53, and a data output step S54.

The error detection step S51 may correspond to a step of detecting an error of the internal data ID<1:K> loaded on the input/output line IO by using the error correction circuit 400a. When an error exists in the internal data ID<1:K> at the error detection step S51 (YES), the error correction circuit 400a may generate the failure detection signal FAIL. The refresh control circuit 500a may store the address signal ADD<1:M> based on the failure detection signal FAIL. When no error exists in the internal data ID<1:K> at the error detection step S51 (NO), the data output step S54 may be performed.

The data error correction step S52 may correspond to a step of correcting an error of the internal data ID<1:K> using an error correction code (ECC) in the error correction circuit 400a.

The address latching step S53 may correspond to a step of storing the address signal ADD<1:M> as the failure address signal FADD<1:M> in the refresh control circuit 500a when the failure detection signal FAIL is enabled.

The data output step S54 may correspond to a step of generating the first to Kth data DATA<1:K> by buffering the internal data ID<1:K>, which is corrected at the data error correction step S52, in the data input/output circuit 300a. The data output step S54 may also correspond to a step of outputting the data DATA<1:K> generated by the data input/output circuit 300a to the controller 10.

The refresh step S6 may include a refresh operation detection step S61, a counting operation step S62, a counting detection step S63, a predetermined number of times detection step S64, a repair detection step S65, a repair operation step S66, a failure refresh step S67, and a normal refresh step S68.

The refresh operation detection step S61 may correspond to a step of generating the refresh signal REF based on the clock signal CLK and the command signal CMD output from the controller 10.

The counting operation step S62 may correspond to a step of detecting the refresh signal REF whenever the refresh signal REF is input to the refresh control circuit 500a.

The counting detection step S63 may correspond to a step of detecting whether the refresh signal REF is input to the refresh control circuit 500a by the first predetermined number of times.

When the refresh signal REF is input to the refresh control circuit 500a by the first predetermined number of times at the counting detection step S63 (YES), the repair detection step S65 may be performed.

The predetermined number of times detection step S64 may correspond to a step of detecting whether the internal data ID<1:K> including an error at the address latching step S53 are input by the second predetermined number of times.

When the internal data ID<1:K> including an error are input by the second predetermined number of times at the predetermined number of times detection step S64 (YES), the repair detection step S65 may be performed.

When the refresh signal REF is input to the refresh control circuit 500a by the first predetermined number of times or more at the counting detection step S63 (YES), the repair detection step S65 may be performed. When the refresh signal REF is input to the refresh control circuit 500a by the number of times less than the first predetermined number of times at the counting detection step S63 (NO), the normal refresh step S68 may be performed.

The repair detection step S65 may correspond to a step of detecting whether the internal data ID<1:K> including an error are input by the third predetermined number of times. When the internal data ID<1:K> including an error are input by the third predetermined number of times (YES) at the repair detection step S65, the repair operation step S66 may be performed.

The repair operation step S66 may perform the repair operation of replacing a word line connected to memory cells storing the internal data ID<1:K> including an error with a repair line in the core circuit 200a.

When the internal data ID<1:K> including an error are not input by the third predetermined number of times (NO) at the repair detection step S65, the failure refresh step S67 may be performed.

The failure refresh step S67 may correspond to a step of generating the refresh address signal REF_ADD<1:M> for activating a word line, which is connected to memory cells storing the internal data ID<1:K> including an error, from the address signal ADD<1:M> in the refresh control circuit 500a. The failure refresh step S67 may correspond to a step of performing the refresh operation by additionally activating the failed word line, which is selected by the refresh address signal REF_ADD<1:M>, in the core circuit 200a.

The normal refresh step S68 may correspond to a step of generating the refresh address signal REF_ADD<1:M>, which are sequentially enabled to sequentially activate multiple word lines included in the core circuit 220a, in the refresh control circuit 500a. The normal refresh step S68 may correspond to a step of performing the refresh operation by sequentially activating the multiple word lines in the core circuit 200a based on the refresh signal REF and the refresh address signal REF_ADD<1:M> which are sequentially counted.

An error correction method of the semiconductor system 1 according to another embodiment of the present disclosure may improve the reliability of internal data by replacing a failed word line connected to failed memory cells with a repair line when an address signal for selecting the failed memory cells storing failed internal data is input by a third predetermined number of times during a refresh operation.

As described above with reference to FIGS. 1 to 12, an error correction method according to an embodiment of the present disclosure and the semiconductor device and semiconductor system used in the error correction method may improve the reliability of internal data by additionally refreshing a word line connected to failed memory cells storing erroneous internal data when a refresh signal is repeatedly input by a first predetermined number of times during a refresh operation. The error correction method and the semiconductor device and semiconductor system used in the error correction method may improve the reliability of internal data by additionally refreshing a word line connected to failed memory cells storing erroneous internal data when an address signal for selecting the failed memory cells is input by a second predetermined number of times during the refresh operation. The error correction method and the semiconductor device and semiconductor system used in the error correction method may improve the reliability of internal data by replacing a word line connected to the failed memory cells with a repair line when an address signal for selecting the failed memory cells is input by a third predetermined number of times during the refresh operation.

Figure 13:
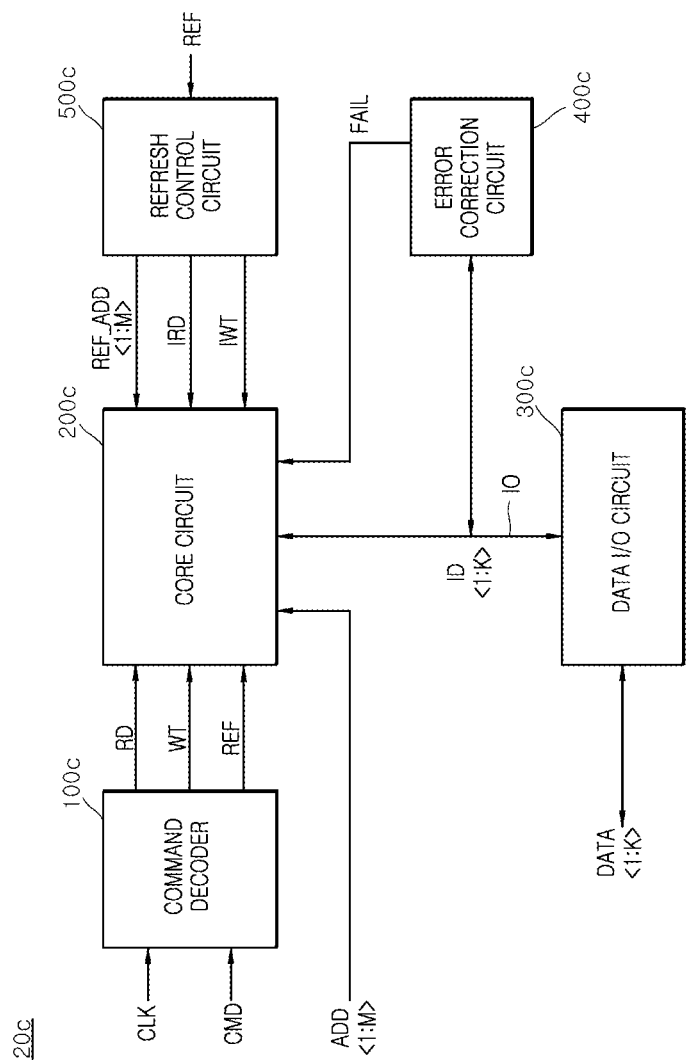
FIG. 13 is a block diagram illustrating a configuration of a semiconductor device according to another embodiment of the present disclosure.

FIG. 13 is a block diagram illustrating a configuration of a semiconductor device 20c according to another embodiment of the present disclosure. As illustrated in FIG. 13, the semiconductor device 20c may include a command decoder 100c, a core circuit 200c, a data input/output circuit 300c, an error correction circuit 400c, and a refresh control circuit 500c.

The command decoder 100c may be synchronized with a clock signal CLK to generate a read signal RD, a write signal WT, and a refresh signal REF, one of which is selectively enabled from a command signal CMD. The command decoder 100c may generate the read signal RD for performing a read operation by decoding the command signal CMD in synchronization with the clock signal CLK. The command decoder 100c may generate the write signal WT for performing a write operation by decoding the command signal CMD in synchronization with the clock signal CLK. The command decoder 100c may generate the refresh signal REF for performing a refresh operation by decoding the command signal CMD in synchronization with the clock signal CLK.

The core circuit 200c may output internal data ID<1:K> stored therein based on the read signal RD and address signal ADD<1:M> during the read operation. The core circuit 200c may store the internal data ID<1:K> based on the write signal WT and the address signal ADD<1:M> during the write operation. The core circuit 200c may sequentially activate multiple word lines based on the refresh signal REF and refresh address signal REF_ADD<1:M> during the refresh operation. The core circuit 200c may store the address signal ADD<1:M> as first to fourth failure address signals (F_ADD1<1:M>~F_ADD4<1:M> of FIG. 14) when a failure detection signal FAIL is input during the read operation. As used herein, the tilde "~" indicates a range of components. For example, "F_ADD1<1:M>~F_ADD4<1:M" indicates the failure address signals F_ADD1<1:M>, F_ADD2<1:M>, . . . , and F_ADD4<1:M> shown in FIG. 14. The core circuit 200c may perform a read modify write operation to output the internal data ID<1:K> by the first to fourth failure address signals (F_ADD1<1:M>~F_ADD4<1:M> of FIG. 14) and store the internal data ID<1:K> that has been error-corrected (i.e., error corrected internal data ID<1:K>) during the refresh operation. The core circuit 200c may output internal data ID<1:K> based on an internal read signal IRD and the first to fourth failure address signals (F_ADD1<1:M>~F_ADD4<1:M> of FIG. 14) during the refresh operation. The core circuit 200c may store the error-corrected internal data ID<1:K> based on an internal write signal IWT and the first to fourth failure address signals (F_ADD1<1:M>~F_ADD4<1:M> of FIG. 14) during the refresh operation. The internal data ID<1:K> may be output through an input/output line IO during the read operation and the refresh operation. The internal data ID<1:K> may be input through the input/output line IO during the write operation and the refresh operation. The number of bits "K" of the internal data ID<1:K> may be set to various numbers according to an embodiment. The number of bits "M" of the address signal ADD<1:M>, refresh address signal REF_ADD<1:M>, and the first to fourth failure address signals (F_ADD1<1:M>~F_ADD4<1:M> of FIG. 14) may be set to various numbers according to an embodiment.

The data input/output circuit 300c may buffer the internal data ID<1:K> loaded on the input/output line IO to generate the data DATA<1:K> during the read operation. The data input/output circuit 300c may output the generated data DATA<1:K> to the controller (10 of FIG. 1) during the read operation. The data input/output circuit 300c may receive the data DATA<1:K> from the controller (10 of FIG. 1) and buffer the data DATA<1:K> to generate the internal data ID<1:K> during the write operation. The data input/output circuit 300c may output the generated internal data ID<1:K> through the input/output line IO during the write operation. Although FIG. 2 illustrates the input/output line IO with a single line, the input/output line IO may be configured to include multiple lines. The number of bits "K" of the data DATA<1:K> may be set to various numbers according to an embodiment.

The error correction circuit 400c may detect an error of the internal data ID<1:K> loaded on the input/output line IO during the read operation and the refresh operation. The error correction circuit 400c may correct the error of the internal data ID<1:K> during the read operation and the refresh operation and may output the error-corrected internal data ID<1:K> through the input/output line JO. The error correction circuit 400c may generate a failure detection signal FAIL which is enabled when an error occurs in the internal data ID<1:K> loaded on the input/output line IO during the read operation. The error correction circuit 400c may detect the error of the internal data ID<1:K> loaded on the input/output line IO during the write operation. The error correction circuit 400c may correct the error of the internal data ID<1:K> during the write operation and may output the error-corrected internal data ID<1:K> through the input/output line IO. The error correction circuit 400c may be implemented using a general ECC circuit that corrects an error using an error correction code (ECC).

The refresh control circuit 500c may generate refresh address signals REF_ADD<1:M> for sequentially activating the multiple word lines when the refresh signal REF is input. The refresh control circuit 500c may generate the internal read signal IRD and the internal write signal IWT for performing the read modify write operation when the refresh signal REF is input. The refresh control circuit 500c may generate the internal read signal IRD and the internal write signal IWT which are sequentially generated when the refresh signal REF is input. A time difference from the time when the internal read signal IRD is generated to the time when the internal write signal IWT is generated may be set to be longer than the time for correcting the error of the internal data ID<1:K> in the error correction circuit 400c. Although the refresh control circuit 500c is implemented to operate by receiving the refresh signal REF, the refresh control circuit 500c may be implemented to operate by receiving an error scrub signal (not shown) according to an embodiment. The error scrub signal (not shown) may be set as a signal generated to perform an error scrub operation of checking the occurrence of errors in the internal data ID<1:K> stored through all word lines included in the core circuit 200c and providing the controller (10 of FIG. 1) with an address signal ADD<1:M> for activating the word line in which the most errors occur.

The semiconductor device 20c may be synchronized with the clock signal CLK to generate the data DATA<1:K> from the internal data ID<1:K> stored therein and to output the data DATA<1:K> to the controller (10 of FIG. 1) during the read operation. The semiconductor device 20c may receive the data DATA<1:K> from the controller (10 of FIG. 1) in synchronization with the clock signal CLK to generate and store the internal data ID<1:K> therein during the write operation. The semiconductor device 20c may perform the refresh operation based on the refresh address signal REF_ADD<1:M> during the refresh operation. The semiconductor device 20c may store the error-corrected internal data ID<1:K> based on the first to fourth failure address signals (F_ADD1<1:M>~F_ADD4<1:M> of FIG. 14) during the refresh operation.

Figure 14:
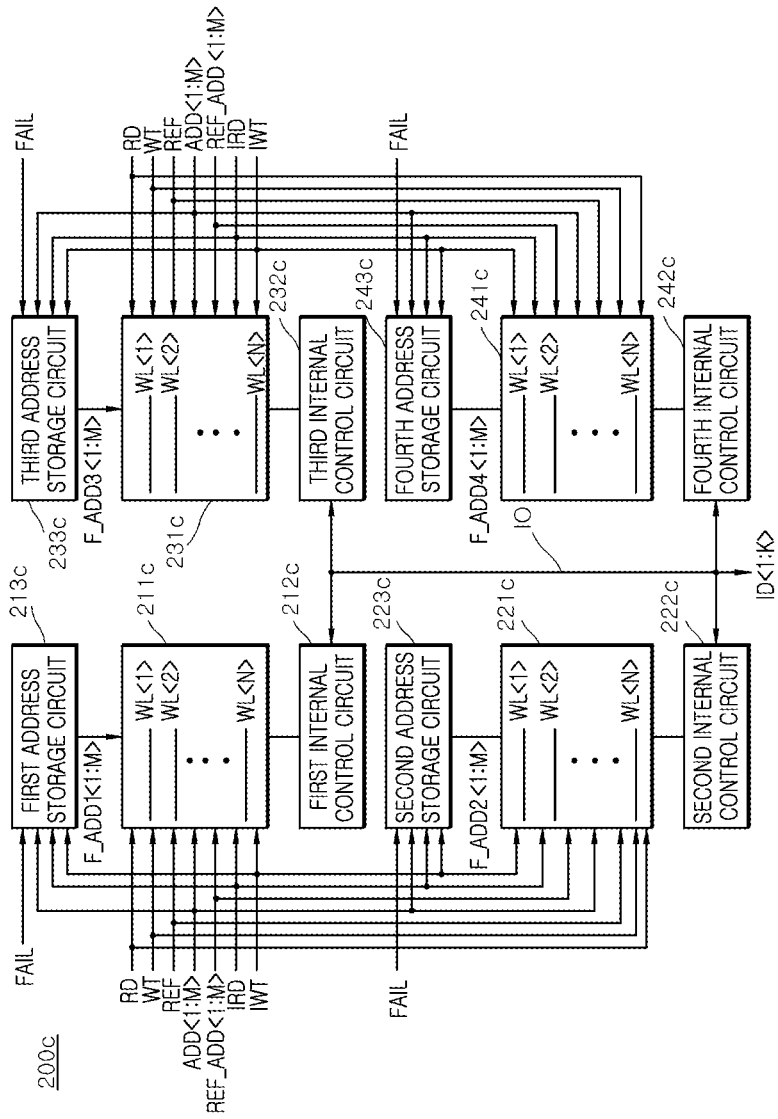
FIG. 14 is a block diagram illustrating a configuration of a core circuit included in the semiconductor device illustrated in FIG. 13.

FIG. 14 is a block diagram illustrating a configuration of according to an embodiment of the core circuit 200c illustrated in FIG. 13. As illustrated in FIG. 14, the core circuit 200c may include a first memory region 211c, a first internal control circuit 212c, a first address storage circuit 213c, a second memory region 221c, a second internal control circuit 222c, a second address storage circuit 223c, a third memory region 231c, a third internal control circuit 232c, a third address storage circuit 233c, a fourth memory region 241c, a fourth internal control circuit 242c, and a fourth address storage circuit 243c.

The first memory region 211c may include first to Nth word lines WL<1:N>. When the read signal RD is input to the first memory region 211c, the first memory region 211c may output the internal data ID<1:K> stored therein through a word line, which is activated by the address signal ADD<1:M>, among the first to Nth word lines WL<1:N>. When the write signal WT is input to the first memory region 211c, the first memory region 211c may store the internal data ID<1:K> therein through a word line, which is activated by the address signal ADD<1:M>, among the first to Nth word lines WL<1:N>. When the refresh signal REF is input to the first memory region 211c, the first memory region 211c may sequentially activate the first to Nth word lines WL<1:N> based on the refresh address signal REF_ADD<1:M>. When the internal read signal IRD is input to the first memory region 211c, the first memory region 211c may output the internal data ID<1:K> stored therein through a word line, which is activated by the first failure address signal F_ADD1<1:M>, among the first to Nth word lines WL<1:N>. When the internal write signal IWT is input to the first memory region 211c, the first memory region 211c may store the error-corrected internal data ID<1:K> to the word line, which is activated by the first failure address signal F_ADD1<1:M>, among the first to Nth word lines WL<1:N>.

The first internal control circuit 212c may be electrically connected to the first memory region 211c. The first internal control circuit 212c may output the internal data ID<1:K> output from the first memory region 211c through the input/output line JO during the read operation and the refresh operation. The first internal control circuit 212c may output the internal data ID<1:K> loaded on the input/output line JO to the first memory region 211c during the write operation and the refresh operation. The first internal control circuit 212c may be implemented using a general differential amplification circuit that senses and amplifies the internal data ID<1:K>.

The first address storage circuit 213c may be electrically connected to the first memory region 211c. When the failure detection signal FAIL is input to the first address storage circuit 213c, the first address storage circuit 213c may store the address signal ADD<1:M> as the first failure address signal F_ADD1<1:M>. When the internal read signal IRD is input to the first address storage circuit 213c, the first address storage circuit 213c may output the stored first failure address signal F_ADD1<1:M> to the first memory region 211c. When the internal write signal IWT is input to the first address storage circuit 213c, the first address storage circuit 213c may output the stored first failure address signal F_ADD1<1:M> to the first memory region 211c. The first failure address signal F_ADD1<1:M> may be generated from the address signal ADD<1:M> including information on a location in which the internal data ID<1:K> including an error is stored in the first memory region 211c.

The second memory region 221c may include first to Nth word lines WL<1:N>. When the read signal RD is input to the second memory region 221c, the second memory region 230 may output the internal data ID<1:K> stored therein through a word line, which is activated by the address signal ADD<1:M>, among the first to Nth word lines WL<1:N>. When the write signal WT is input to the second memory region 221c, the second memory region 221c may store the internal data ID<1:K> through a word line, which is activated by the address signal ADD<1:M>, among the first to Nth word lines WL<1:N>. When the refresh signal REF is input to the second memory region 221c, the second memory region 221c may sequentially activate the first to Nth word lines WL<1:N> based on the refresh address signal REF_ADD<1:M>. When the internal read signal IRD is input to the second memory region 221c, the second memory region 221c may output the internal data ID<1:K> stored therein through a word line, which is activated by the second failure address signal F_ADD2<1:M>, among the first to Nth word lines WL<1:N>. When the internal write signal IWT is input to the second memory region 221c, the second memory region 221c may store the internal data ID<1:K> that has been error-corrected (i.e., error-corrected internal data ID<1:K>) to the word line, which is activated by the second failure address signal F_ADD2<1:M>, among the first to Nth word lines WL<1:N>.

The second internal control circuit 222c may be electrically connected to the second memory region 221c. The second internal control circuit 222c may output the internal data ID<1:K> output from the second memory region 221c through the input/output line JO during the read operation and the refresh operation. The second internal control circuit 222c may output the internal data ID<1:K> loaded on the input/output line JO to the second memory region 221c during the write operation and the refresh operation. The second internal control circuit 222c may be implemented using a general differential amplification circuit that senses and amplifies the internal data ID<1:K>.

The second address storage circuit 223c may be electrically connected to the second memory region 221c. When the failure detection signal FAIL is input to the second address storage circuit 223c, the second address storage circuit 223c may store the address signal ADD<1:M> as the second failure address signal F_ADD2<1:M>. When the internal read signal IRD is input to the second address storage circuit 223c, the second address storage circuit 223c may output the stored second failure address signal F_ADD2<1:M> to the second memory region 221c. When the internal write signal IWT is input to the second address storage circuit 223c, the second address storage circuit 223c may output the stored second failure address signal F_ADD2<1:M> to the second memory region 221c. The second failure address signal F_ADD2<1:M> may be generated from the address signal ADD<1:M> including information on a location in which the internal data including an error stored in the second memory region 221c.

The third memory region 231c may include first to Nth word lines WL<1:N>. When the read signal RD is input to the third memory region 231c, the third memory region 231c may output the internal data ID<1:K> stored therein through a word line, which is activated by the address signal ADD<1:M>, among the first to Nth word lines WL<1:N>. When the write signal WT is input to the third memory region 231c, the third memory region 231c may store the internal data ID<1:K> therein through a word line, which is activated by the address signal ADD<1:M>, among the first to Nth word lines WL<1:N>. When the refresh signal REF is input to the third memory region 231c, the third memory region 231c may sequentially activate the first to Nth word lines WL<1:N> by the refresh address signal REF_ADD<1:M>. When the internal read signal IRD is input to the third memory region 231c, the third memory region 231c may output the internal data ID<1:K> stored therein through a word line, which is activated by the third failure address signal F_ADD3<1:M>, among the first to Nth word lines WL<1:N>. When the internal write signal IWT is input to the third memory region 231c, the third memory region 231c may store the error-corrected internal data ID<1:K> to the word line, which is activated by the third failure address signal F_ADD3<1:M>, among the first to Nth word lines WL<1:N>.

The third internal control circuit 232c may be electrically connected to the third memory region 231c. The third internal control circuit 232c may output the internal data ID<1:K> output from the third memory region 231c through the input/output line JO during the read operation and the refresh operation. The third internal control circuit 232c may output the internal data ID<1:K> loaded on the input/output line JO to the third memory region 231c during the write operation and the refresh operation. The third internal control circuit 232c may be implemented using a general differential amplification circuit that senses and amplifies the internal data ID<1:K>.

The third address storage circuit 233c may be electrically connected to the third memory region 231c. When the failure detection signal FAIL is input to the third address storage circuit 233c, the third address storage circuit 233c may store the address signal ADD<1:M> as the third failure address signal F_ADD3<1:M>. When the internal read signal IRD is input to the third address storage circuit 233c, the third address storage circuit 233c may output the stored third failure address signal F_ADD3<1:M> to the third memory region 231c. When the internal write signal IWT is input to the third address storage circuit 233c, the third address storage circuit 233c may output the stored third failure address signal F_ADD3<1:M> to the third memory region 231c. The third failure address signal F_ADD3<1:M> may be generated from the address signal ADD<1:M> including information on a location in which the internal data ID<1:K> including the error is stored in the third memory region 231c.

The fourth memory region 241c may include first to Nth word lines WL<1:N>. When the read signal RD is input to the fourth memory region 241c, the fourth memory region 241c may output the internal data ID<1:K> stored therein through a word line, which is activated by the address signal ADD<1:M>, among the first to Nth word lines WL<1:N>. When the write signal WT is input to the fourth memory region 241c, the fourth memory region 241c may store the internal data ID<1:K> through a word line, which is activated by the address signal ADD<1:M>, among the first to Nth word lines WL<1:N>. When the refresh signal REF is input to the fourth memory region 241c, the fourth memory region 241c may sequentially activate the first to Nth word lines WL<1:N> by the refresh address signal REF_ADD<1:M>. When the internal read signal IRD is input to the fourth memory region 241c, the fourth memory region 241c may output the internal data ID<1:K> stored therein through a word line, which is activated by a fourth failure address signal F_ADD4<1:M>, among the first to Nth word lines WL<1:N>. When the internal write signal IWT is input to the fourth memory region 241c, the fourth memory region 241c may store the error-corrected internal data ID<1:K> through a word line, which is activated by fourth failure address signal F_ADD4<1:M>, among the first to Nth word lines WL<1:N>.

The fourth internal control circuit 242c may be electrically connected to the fourth memory region 241c. The fourth internal control circuit 242c may output the internal data ID<1:K> output from the fourth memory region 241c through the input/output line JO during the read operation and the refresh operation. The fourth internal control circuit 242c may output the internal data ID<1:K> loaded on the input/output line JO to the fourth memory region 241c during the write operation and the refresh operation. The fourth internal control circuit 242c may be implemented using a general differential amplification circuit that senses and amplifies the internal data ID<1:K>.

The fourth address storage circuit 243c may be electrically connected to the fourth memory region 241c. When the failure detection signal FAIL is input to the fourth address storage circuit 243c, the fourth address storage circuit 243c may store the address signal ADD<1:M> as the fourth failure address signal F_ADD4<1:M>. When the internal read signal IRD is input to the fourth address storage circuit 243c, the fourth address storage circuit 243c may output the stored fourth failure address signal F_ADD4<1:M> to the fourth memory region 241c. When the internal write signal IWT is input to the fourth address storage circuit 243c, the fourth address storage circuit 243c may output the stored fourth failure address signal F_ADD4<1:M> to the fourth memory region 241c. The fourth failure address signal F_ADD4<1:M> may be generated from the address signal ADD<1:M> including information on a location in which the internal data ID<1:K> including the error is stored in the fourth memory region 241c.

Although the core circuit 200c shown in FIG. 14 is implemented to include the first to fourth memory regions 211c, 221c, 231c, and 241c, the core circuit 200c may be implemented to include a variable number of memory regions according to an embodiment. In addition, the first to fourth memory regions 211c, 221c, 231c, and 241c may be set as banks.

Figure 15:
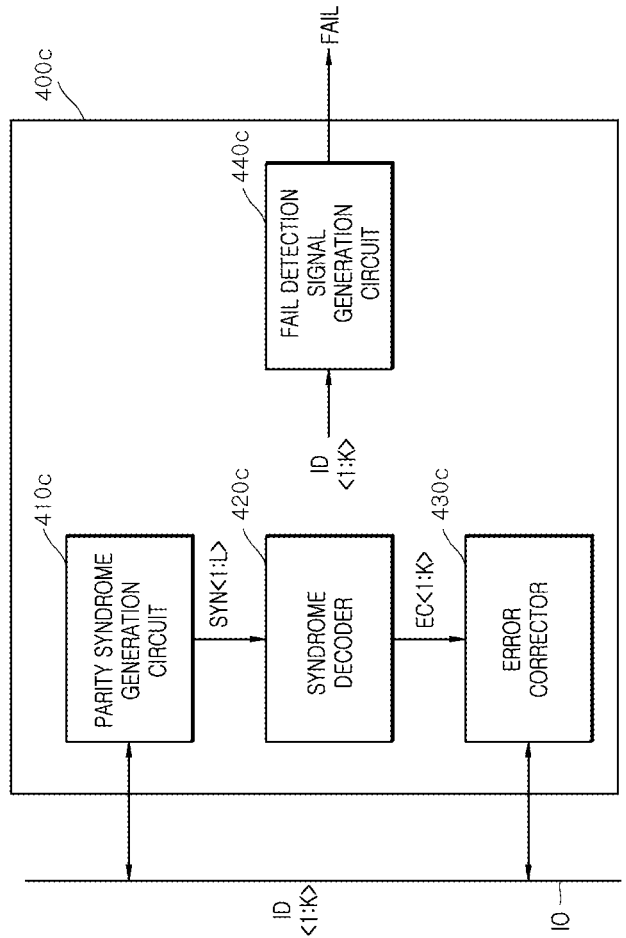
FIG. 15 is a block diagram illustrating a configuration of an error correction circuit included in the semiconductor device illustrated in FIG. 13.

FIG. 15 is a block diagram illustrating a configuration according to an embodiment of the error correction circuit 400c illustrated in FIG. 13. As illustrated in FIG. 15, the error correction circuit 400c may include a parity syndrome generation circuit 410c, a syndrome decoder 420c, an error corrector 430c, and a failure detection signal generation circuit 440c.

The parity syndrome generation circuit 410c may generate a syndrome signal SYN<1:L> including error information of the internal data ID<1:K> loaded on the input/output line IO. The parity syndrome generation circuit 410c may perform an ECC encoding operation on the internal data ID<1:K> to generate a parity and output the parity as some bits of the internal data ID<1:K> during the write operation. The parity syndrome generation circuit 410c may perform the ECC decoding operation on the internal data ID<1:K> output from the core circuit 200c to generate the syndrome signal SYN<1:L> during the read operation. The parity syndrome generation circuit 410c may compare the parity included in the internal data ID<1:K> with a new parity generated by performing the ECC encoding operation on the internal data ID<1:K> to generate the syndrome signal SYN<1:L>.

The syndrome decoder 420c may decode the syndrome signal SYN<1:L> to generate an error correction signal EC<1:K>. The syndrome decoder 420c may perform the ECC decoding operation on the syndrome signal SYN<1:L> to generate the error correction signal EC<1:K>.

The error corrector 430c may correct an error included in the internal data ID<1:K> based on the error correction signal EC<1:K>. The error corrector 430c may receive the internal data ID<1:K> loaded on the input/output line JO and may correct the error included in the internal data ID<1:K> based on the error correction signal EC<1:K> to output the error-corrected internal data ID<1:K> through the input/output line JO. The method of correcting the error included in the internal data ID<1:K> by the error corrector 430c may be performed by inverting bits of the internal data ID<1:K> based on the error correction signal EC<1:K>. For example, when an error occurs in the Kth bit ID<K> of the internal data, the Kth bit ID<K> of the internal data may be inverted by the Kth bit EC<K> of the error correction signal so that the error may be corrected.

The failure detection signal generation circuit 440c may detect an error included in the internal data ID<1:K> to generate the failure detection signal FAIL. The failure detection signal generation circuit 440c may generate the failure detection signal FAIL that is generated when an error occurs in the internal data ID<1:K> output from the core circuit 200c during the read operation. For example, the failure detection signal generation circuit 440c may generate the failure detection signal FAIL that is generated when the parity included in the internal data ID<1:K> output from the core circuit 200c and the new parity generated by performing the ECC encoding operation on the internal data ID<1:K> are different from each other.

Meanwhile, the ECC encoding operation may include an operation of generating the parity on the internal data ID<1:K>. The ECC decoding operation may include operations of generating the syndrome signal SYN<1:L> using the parity on the internal data ID<1:K>, identifying an error location using the generated syndrome signal SYN<1:L>, and correcting the error having a location that has been identified.

Figure 16:
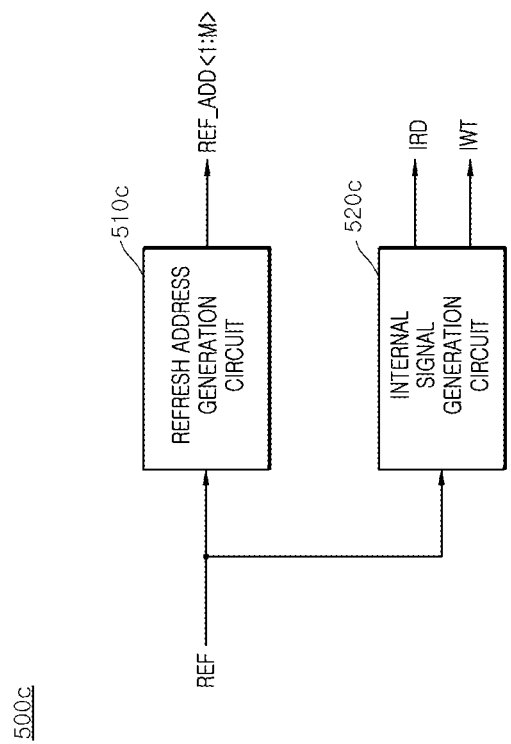
FIG. 16 is a block diagram illustrating a configuration of a refresh control circuit included in the semiconductor device illustrated in FIG. 13.

FIG. 16 is a block diagram illustrating a configuration according to an embodiment of the refresh control circuit 500c illustrated in FIG. 13. As illustrated in FIG. 16, the refresh control circuit 500c may include a refresh address generation circuit 510c and an internal signal generation circuit 520c.

The refresh address generation circuit 510c may generate a refresh address signal REF_ADD<1:M> for sequentially activating the multiple word lines when the refresh signal REF is input. The refresh address generation circuit 510c may generate the refresh address signal REF_ADD<1:M> that is counted when the refresh signal REF is input.

The internal signal generation circuit 520c may generate the internal read signal IRD and the internal write signal IWT for performing the read modify write operation when the refresh signal REF is input. The internal signal generation circuit 520c may generate the internal read signal IRD when the refresh signal REF is input, and then may generate the internal write signal IWT. A time difference from the time when the internal read signal IRD is generated to the time when the internal write signal IWT is generated may be set to be longer than the time for correcting the error of the internal data ID<1:K> in the error correction circuit 400c.

Figure 17:
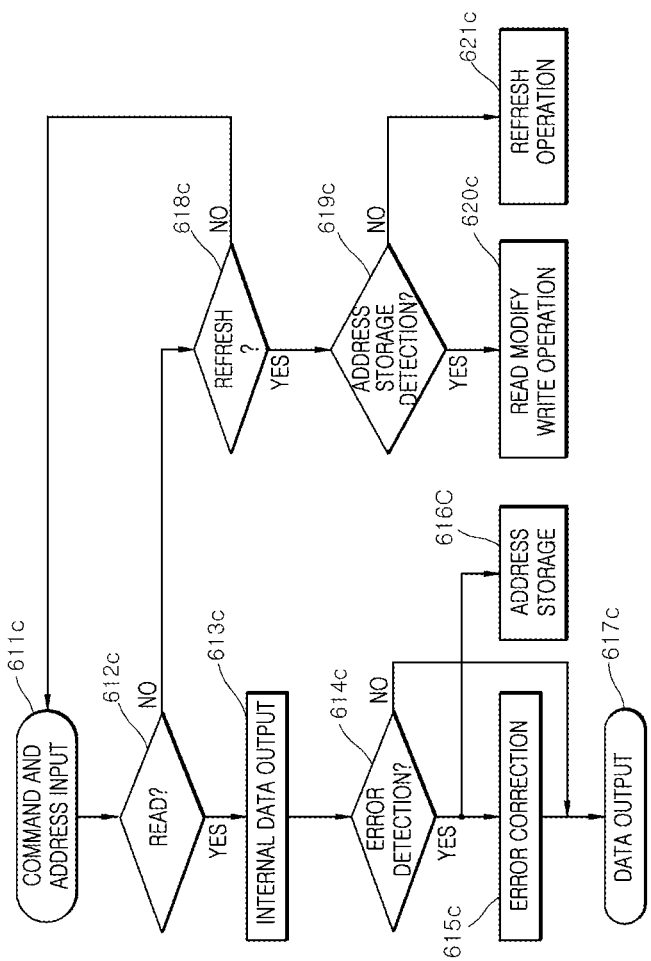
FIG. 17 is a flowchart illustrating an error correction method of a semiconductor system according to another embodiment of the present disclosure.

FIG. 17 is a flowchart illustrating an error correction method of a semiconductor system according to another embodiment of the present disclosure. The error correction method of the semiconductor system according to another embodiment of the present disclosure will be described with reference to FIG. 17 as follows. The error correction method may include a command and address input operation 611c, a read detection operation 612c, an internal data output operation 613c, an error detection operation 614c, an error correction operation 615c, an address storage operation 616c, a data output operation 617c, a refresh detection operation 618c, an address storage detection operation 619c, a read modify write operation 620c, and a refresh operation 621c.

The command and address input operation 611c may be set as an operation of inputting a command signal CMD and an address signal ADD<1:M> to a semiconductor device (20c of FIG. 13) from a controller (10 of FIG. 1).

The read detection operation 612c may be set as an operation of determining whether the command signal CMD has a logic level combination for performing a read operation. In the read detection operation 612c, when the command signal CMD has a logic level combination for performing the read operation (YES), the internal data output operation 613c may be entered. In the read detection operation 612c, a command decoder (100c of FIG. 13) may generate a read signal RD generated when the command signal CMD has a logic level combination for performing the read operation (YES). In the read detection operation 612c, when the command signal CMD does not have a logic level combination for performing the read operation (NO), the refresh detection operation 618c may be entered.

The internal data output operation 613c may be set as an operation of outputting an internal data ID<1:K> stored in a word line activated by an address signal ADD<1:M> when the command signal CMD has a logic level combination for performing the read operation (YES). In the internal data output operation 613c, a core circuit (200c of FIG. 13) may output the internal data ID<1:K> stored in the word line activated by the read signal RD and the address signal ADD<1:M> to an input/output line IO. After the internal data output operation 613c is completed, the error detection operation 614c may be entered.

The error detection operation 614c may be set as an operation of detecting an error of the internal data ID<1:K> loaded on the input/output line IO. In the error detection operation 614c, an error correction circuit (400c of FIG. 13) may detect the error of the internal data ID<1:K> loaded on the input/output line IO. In the error detection operation 614c, the error correction circuit 400c may generate a failure detection signal FAIL generated when an error is included in the internal data ID<1:K> (YES). When an error is included in the internal data ID<1:K> in the error detection operation 614c (YES), the error correction operation 615c may be entered. When an error is included in the internal data ID<1:K> in the error detection operation 614c (YES), the address storage operation 616c may be entered. When an error is not included in the internal data ID<1:K> in the error detection operation 614c (NO), the data output operation 617c may be entered.

The error correction operation 615c may be set as an operation of correcting the error of the internal data ID<1:K> loaded on the input/output line IO. In the error correction operation 615c, the error correction circuit 400c may perform an ECC encoding operation and an ECC decoding operation on the internal data ID<1:K> loaded on the input/output line IO to correct the error included in the internal data ID<1:K>. In the error correction operation 615c, the error correction circuit 400c may output the error-corrected internal data ID<1:K> through the input/output line IO.

The address storage operation 616c may be set as an operation of storing the address signal ADD<1:M> as first to fourth failure address signals F_ADD1<1:M>~F_ADD4<1:M> when the failure detection signal FAIL is generated. In the address storage operation 616c, a first address storage circuit (213c of FIG. 14) of the core circuit 200c may store the address ADD<1:M> as the first failure address F_ADD1<1:M> when the failure detection signal FAIL is generated. In the address storage operation 616c, the second address storage circuit (223c of FIG. 14) of the core circuit 200c may store the address ADD<1:M> as the second failure address F_ADD2<1:M> when the failure detection signal FAIL is generated. In the address storage operation 616c, the third address storage circuit (233c of FIG. 14) of the core circuit 200c may store the address ADD<1:M> as the third failure address F_ADD3<1:M> when the failure detection signal FAIL is generated. In the address storage operation 616c, the fourth address storage circuit (243c of FIG. 14) of the core circuit 200c may store the address ADD<1:M> as the fourth failure address F_ADD4<1:M> when the failure detection signal FAIL is generated.

The data output operation 617c may be set as an operation of outputting the internal data ID<1:K> that does not include an error as data DATA<1:K>. In the data output operation 617c, the data input/output circuit (300c of FIG. 13) may buffer the internal data ID<1:K> that does not include an error and loaded on the input/output line ID to generate the data DATA<1:K> during the read operation. In the data output operation 617c, the data input/output circuit 300c may output the data DATA<1:K> to the controller (10 of FIG. 1).

The refresh detection operation 618c may be set as an operation of determining whether the command signal CMD has a logic level combination for performing a refresh operation. In the refresh detection operation 618c, when the command signal CMD has a logic level combination for performing the refresh operation (YES), the address storage detection operation 619c may be entered. In the refresh detection operation 618c, the command decoder (100c of FIG. 13) may generate a refresh signal REF that is generated when the command signal CMD has a logic level combination for performing the refresh operation (YES). In the refresh detection operation 618c, when the command signal CMD does not have a logic level combination for performing the refresh operation (NO), the command and address input operation 611c may be re-entered.

The address storage detection operation 619c may be set as an operation of detecting whether the first to fourth failure address signals F_ADD1<1:M>~F_ADD4<1:M> are stored. In the address storage detection operation 619c, when the first to fourth failure address signals F_ADD1<1:M>~F_ADD4<1:M> are stored (YES), the read modify write operation 620c may be entered. In the address storage detection operation 619c, when the first to fourth failure address signals F_ADD1<1:M>~F_ADD4<1:M> are not stored (NO), the refresh operation 621c may be entered.

The read modify write operation 620c may be set as an operation of correcting the error of the internal data ID<1:M> stored in a word line that is activated by the first to fourth failure address signals F_ADD1<1:M>~F_ADD4<1:M> to store the error-corrected internal data ID<1:K>. In the read modify write operation 620c, the refresh control circuit (500c of FIG. 13) may generate an internal read signal IRD generated when the refresh signal REF is input. In the read modify write operation 620c, the core circuit 200c may output the internal data ID<1:K> stored in the word line that is activated by the internal read signal IRD and the first to fourth failure address signals F_ADD1<1:M> to F_ADD4<1:M> through the input/output line IO. In the read modify write operation 620c, the error correction circuit (400c of FIG. 13) may perform an ECC encoding operation and an ECC decoding operation on the internal data ID<1:K> loaded on the input/output line JO to correct the error included in the internal data ID<1:K>. In the read modify write operation 620c, the error correction circuit 400c may output the error-corrected internal data ID<1:K> through the input/output line JO. In the read modify write operation 620c, the refresh control circuit 500c may generate the internal write signal IWT after generating the internal read signal IRD. In the read modify write operation 620c, the core circuit 200c may store the error-corrected internal data ID<1:K> in the word line that is activated by the internal write signal IWT and the first to fourth failure address signals F_ADD1<1:M> to F_ADD4<1:M>.

The refresh operation 621c may be set as an operation of sequentially activating the multiple word lines based on the refresh address signal REF_ADD<1:M>. In the refresh operation 621c, the refresh control circuit 500c may generate the refresh address signal REF_ADD<1:M> that are sequentially counted when the refresh signal REF is input. In the refresh operation 621c, the core circuit 200c may perform a refresh operation by sequentially activating the multiple word lines based on the refresh signal REF and the refresh address signal REF_ADD<1:M>.

In the error correction operation according to another embodiment of the present disclosure, the address of a location where the error has occurred is stored as a failure address, and the error in the internal data stored in the word line activated by the failure address is corrected and re-stored during the refresh operation, thereby preventing repeated errors in the internal data. In addition, in the error correction operation, the error of the internal data stored in the word line activated by the failure address is corrected and re-stored, thereby preventing the error correction circuit from being unable to correct the error of the internal data.

Figure 18:
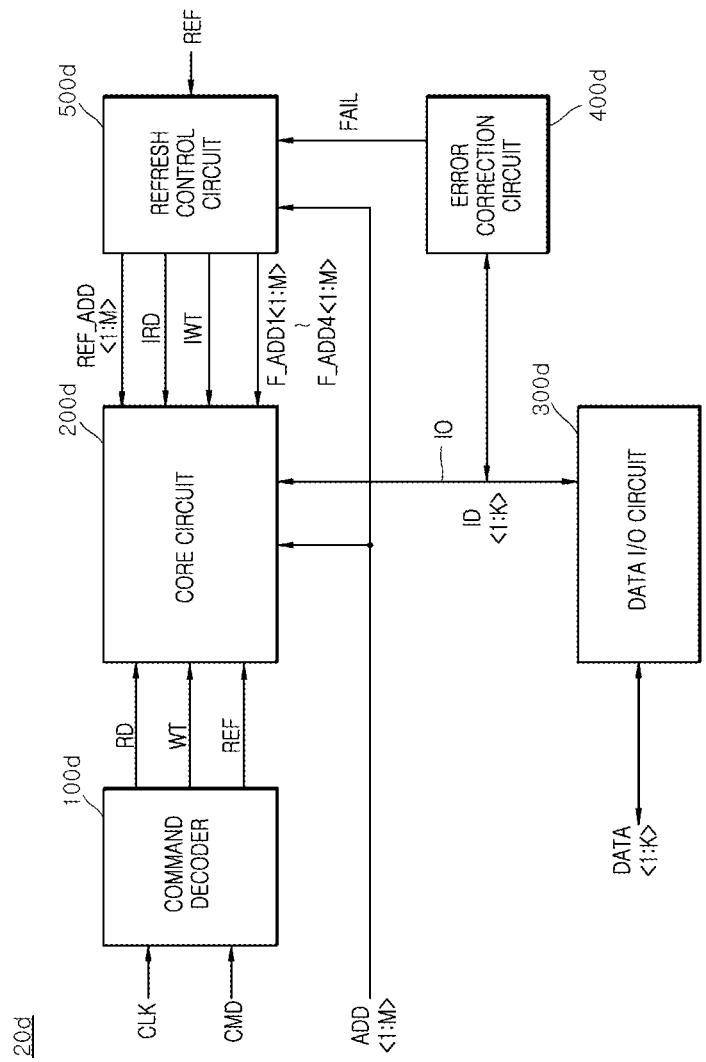
FIG. 18 is a block diagram illustrating a configuration of a semiconductor device according to another embodiment of the present disclosure.

FIG. 18 is a block diagram illustrating a configuration of a semiconductor device 20d according to another embodiment of the semiconductor device 20 illustrated in FIG. 2. As illustrated in FIG. 18, the semiconductor device 20d may include a command decoder 100d, a core circuit 200d, a data input/output circuit 300d, an error correction circuit 400d, and a refresh control circuit 500d.

The command decoder 100d may be synchronized with a clock signal CLK to generate a read signal RD, a write signal WT, and a refresh signal REF, one of which is selectively enabled, from a command signal CMD. The command decoder 100d may decode the command signal CMD in synchronization with the clock signal CLK to generate the read signal RD for performing a read operation. The command decoder 100d may decode the command signal CMD in synchronization with the clock signal CLK to generate the write signal WT for performing a write operation. The command decoder 100d may decode the command signal CMD in synchronization with the clock signal CLK to generate the refresh signal REF for performing a refresh operation.

The core circuit 200d may output internal data ID<1:K> stored therein based on the read signal RD and an address signal ADD<1:M> during the read operation. The core circuit 200d may store the internal data ID<1:K> based on the write signal WT and the address signal ADD<1:M> during the write operation. The core circuit 200d may sequentially activate multiple word lines based on the refresh signal REF and a refresh address signal REF_ADD<1:M> during the refresh operation. The core circuit 200d may output the internal data ID<1:K> based on first to fourth failure address signals F_ADD1<1:M>~F_ADD4<1:M> and store the error-corrected internal data ID<1:K> during the refresh operation. The core circuit 200d may output the internal data ID<1:K> based on an internal read signal IRD and the first to fourth failure address signals F_ADD1<1:M>~F_ADD4<1:M> during the refresh operation. The core circuit 200d may store the error-corrected internal data ID<1:K> based on an internal write signal IWT and the first to fourth failure address signals F_ADD1<1:M>~F_ADD4<1:M> during the refresh operation. The internal data ID<1:K> may be output through an input/output line JO during the read operation and the refresh operation. The internal data ID<1:K> may be input through the input/output line JO during the write operation and the refresh operation. The number of bits "K" of the internal data ID<1:K> may be set to various numbers according to an embodiment. The number of bits "M" of the address ADD<1:M>, the refresh address REF_ADD<1:M>, and the first to fourth failure address signals F_ADD1<1:M>~F_ADD4<1:M> may be set to various numbers according to an embodiment.

The data input/output circuit 300d may buffer the internal data ID<1:K> loaded on the input/output line IO to generate data DATA<1:K> during the read operation. The data input/output circuit 300d may output the generated data DATA<1:K> to the controller (10 of FIG. 1) during the read operation. The data input/output circuit 300d may receive the DATA<1:K> from the controller (10 of FIG. 1) and may generate the internal data ID<1:K> during the write operation. The data input/output circuit 300d may output the internal data ID<1:K> to the input/output line IO during the write operation. Although FIG. 18 illustrates the input/output line IO with a single line, the input/output line IO may be configured to include multiple lines. The number of bits "K" of the data DATA<1:K> may be set to various numbers according to an embodiment.

The error correction circuit 400d may detect an error of the internal data ID<1:K> loaded on the input/output line IO during the read operation and the refresh operation. The error correction circuit 400d may correct the error of the internal data ID<1:K> and may output the error-corrected internal data ID<1:K> to the input/output line IO during the read operation and the refresh operation. The error correction circuit 400d may generate a failure detection signal FAIL that is enabled when an error occurs in the internal data ID<1:K> loaded on the input/output line IO during the read operation. The error correction circuit 400d may detect an error of the internal data ID<1:K> loaded on the input/output line IO during the write operation. The error correction circuit 400d may correct the error of the internal data ID<1:K> and may output the error-corrected internal data ID<1:K> to the input/output line IO during the write operation. The error correction circuit 400a may be implemented using a general ECC circuit that corrects an error using an error correction code (ECC). The error correction circuit 400a is implemented in the same configuration as the error correction circuit 400c shown in FIG. 15 and performs the same operation, so that a detailed description thereof will be omitted.

The refresh control circuit 500d may store the address signal ADD<1:M> as the first to fourth failure address signals F_ADD1<1:M>~F_ADD4<1:M> when the failure detection signal FAIL is input. The refresh control circuit 500d may generate the refresh address signal REF_ADD<1:M> for sequentially activating the multiple word lines when the refresh signal REF is input. The refresh control circuit 500d may output the first to fourth failure address signals F_ADD1<1:M>~F_ADD4<1:M> when the refresh signal REF is input. The refresh control circuit 500d may generate the internal read signal IRD and the internal write signal IWT for performing a read modify write operation when the refresh signal REF is input. The refresh control circuit 500d may generate the internal read signal IRD and the internal write signal IWT that are sequentially generated when the refresh signal REF is input. A time difference from the time when the internal read signal IRD is generated to the time when the internal write signal IWT is generated may be set to be longer than the time for correcting the error of the internal data ID<1:K> in the error correction circuit 400d.

The semiconductor device 20d having the aforementioned configuration may generate the DATA<1:K> from the internal data ID<1:K> stored therein in synchronization with the clock CLK and may output the data DATA<1:K> to the controller (10 of FIG. 1) during the read operation. The semiconductor device 20d may receive the DATA<1:K> from the controller (10 of FIG. 1) in synchronization with the clock signal CLK to generate the internal data ID<1:K> and to store the internal data ID<1:K> therein during the write operation. The semiconductor device 20d may perform the refresh operation based on the refresh address signal REF_ADD<1:M> during the refresh operation. The semiconductor device 20d may store the error-corrected internal data ID<1:K> based on the first to fourth failure address signals F_ADD1<1:M>~F_ADD4<1:M> during the refresh operation.

Figure 19:
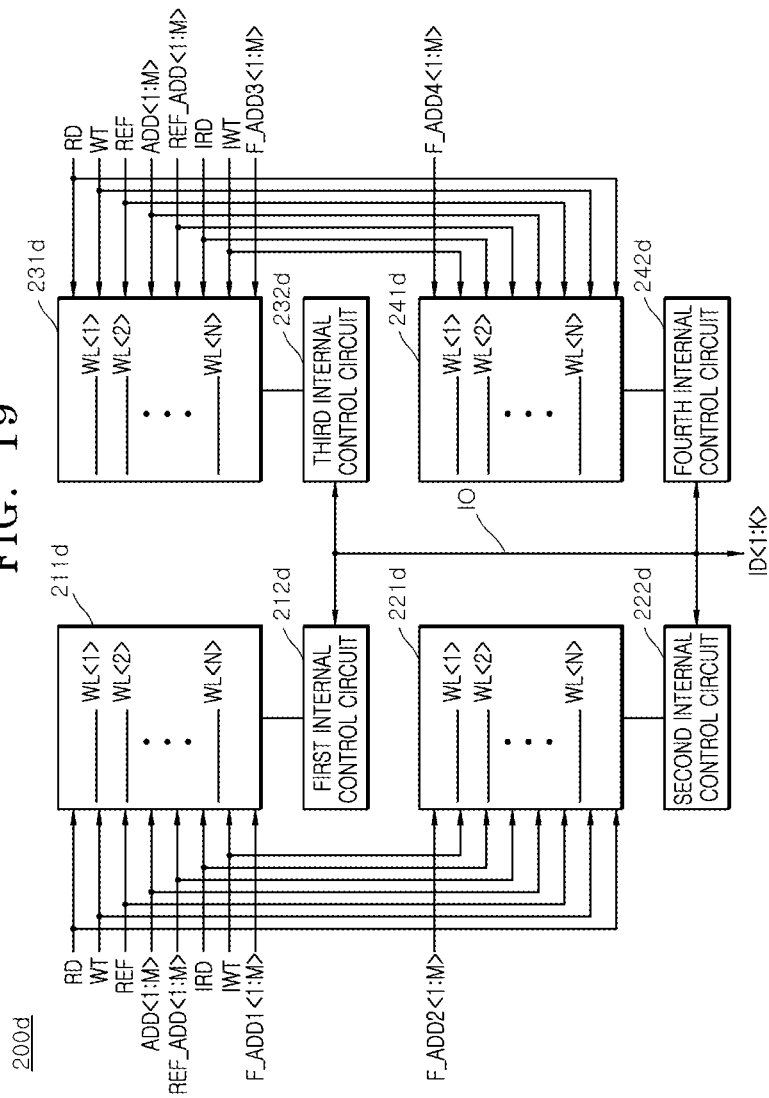
FIG. 19 is a block diagram illustrating a configuration of a core circuit included in the semiconductor device illustrated in FIG. 18.

FIG. 19 is a block diagram illustrating a configuration according to an embodiment of the core circuit 200d illustrated in FIG. 18. As illustrated in FIG. 19, the core circuit 200d may include a first memory region 211d, a first internal control circuit 212d, a second memory region 221d, a second internal control circuit 222d, a third memory region 231d, a third internal control circuit 232d, a fourth memory region 241d, and a fourth internal control circuit 242d.

The first memory region 211d may include first to Nth word lines WL<1:N>. The first memory region 211d may output internal data ID<1:K> stored therein through the word line, which is activated by an address signal ADD<1:M>, among the first to Nth word lines WL<1:N> when a read signal RD is input. The first memory region 211d may store the internal data ID<1:K> through the word line, which is activated by the address signal ADD<1:M>, among the first to Nth word lines WL<1:N> when a write signal WT is input. The first memory region 211d may sequentially activate the first to Nth word lines WL<1:N> based on a refresh address signal REF_ADD<1:M> when a refresh signal REF is input. The first memory region 211d may output the internal data ID<1:K> stored therein through the word line, which is activated by a first failure address signal F_ADD1<1:M>, among the first to Nth word lines WL<1:N> when an internal read signal IRD is input. The first memory region 211d may store the error-corrected internal data ID<1:K> to the word line, which is activated by the first failure address signal F_ADD1<1:M>, among the first to Nth word lines WL<1:N> when an internal write signal IWT is input.

The first internal control circuit 212d may be electrically connected to the first memory region 211d. The first internal control circuit 212d may output the internal data ID<1:K> output from the first memory region 211d through an input/output line JO during the read operation and the refresh operation. The first internal control circuit 212d may output the internal data ID<1:K> load on the input/output line JO to the first memory region 211d during the write operation and the refresh operation. The first internal control circuit 212d may be implemented using a general differential amplification circuit that senses and amplifies the internal data ID<1:K>.

The second memory region 221d may include first to Nth word lines WL<1:N>. The second memory region 221d may output the internal data ID<1:K> stored therein through the word line, which is activated by the address signal ADD<1:M>, among the first to Nth word lines WL<1:N> when the read signal RD is input. The second memory region 221d may store the internal data ID<1:K> through the word line, which is activated by the address signal ADD<1:M>, among the first to Nth word lines WL<1:N> when the write signal WT input. The second memory region 221d may sequentially activate the first to Nth word lines WL<1:N> based on the refresh address signal REF_ADD<1:M> when the refresh signal REF is input. The second memory region 221d may output the internal data ID<1:K> stored therein through the word line, which is activated by the second failure address signal F_ADD2<1:M>, among the first to Nth word lines WL<1:N> when the internal read signal IRD is input. The second memory region 221d may store the error-corrected internal data ID<1:K> to the word line, which is activated by the second failure address signal F_ADD2<1:M>, among the first to Nth word lines WL<1:N> when the internal write signal IWT is input.

The second internal control circuit 222d may be electrically connected to the second memory region 221d. The second internal control circuit 222d may output the internal data ID<1:K> output from the second memory region 221*d* through the input/output line JO during the read operation and the refresh operation. The second internal control circuit 222*d* may output the internal data ID<1:K> load on the input/output line JO to the second memory region 221*d* during the write operation and the refresh operation. The second internal control circuit 222*d* may be implemented using a general differential amplification circuit that senses and amplifies the internal data ID<1:K>.

The third memory region 231*d* may include first to Nth word lines WL<1:N>. The third memory region 231*d* may output the internal data ID<1:K> stored therein through the word line, which is activated by the address signal ADD<1:M>, among the first to Nth word lines WL<1:N> when the read signal RD is input. The third memory region 231*d* may store the internal data ID<1:K> through the word line, which is activated by the address signal ADD<1:M>, among the first to Nth word lines WL<1:N> when the write signal WT is input. The third memory region 231*d* may sequentially activate the first to Nth word lines WL<1:N> based on the refresh address signal REF_ADD<1:M> when the refresh signal REF is input. The third memory region 231*d* may output the internal data ID<1:K> stored therein through the word line, which is activated by the third failure address signal F_ADD3<1:M>, among the first to Nth word lines WL<1:N> when the internal read signal IRD is input. The third memory region 231*d* may store the error-corrected internal data ID<1:K> to the word line, which is activated by the third failure address signal F_ADD3<1:M>, among the first to Nth word lines WL<1:N> when the internal write signal IWT is input.

The third internal control circuit 232*d* may be electrically connected to the third memory region 231*d*. The third internal control circuit 232*d* may output the internal data ID<1:K> output from the third memory region 231*d* through the input/output line JO during the read operation and the refresh operation. The third internal control circuit 232*d* may output the internal data ID<1:K> load on the input/output line JO to the third memory region 231*d* during the write operation and the refresh operation. The third internal control circuit 232*d* may be implemented using a general differential amplification circuit that senses and amplifies the internal data ID<1: K>.

The fourth memory region 241*d* may include first to Nth word lines WL<1:N>. The fourth memory region 241*d* may output the internal data ID<1:K> stored therein through the word line, which is activated by the address signal ADD<1:M>, among the first to Nth word lines WL<1:N> when the read signal RD is input. The fourth memory region 241*d* may store the internal data ID<1:K> through the word line, which is activated by the address signal ADD<1:M>, among the first to Nth word lines WL<1:N> when the write signal WT is input. The fourth memory region 241*d* may sequentially activate the first to Nth word lines WL<1:N> based on the refresh address signal REF_ADD<1:M> when the refresh signal REF is input. The fourth memory region 241*d* may output the internal data ID<1:K> stored therein through the word line, which is activated by the fourth failure address signal F_ADD4<1:M>, among the first to Nth word lines WL<1:N> when the internal read signal IRD is input. The fourth memory region 241*d* may store the error-corrected internal data ID<1:K> to the word line, which is activated by the fourth failure address signal F_ADD4<1:M>, among the first to Nth word lines WL<1:N> when the internal write signal IWT is input.

The fourth internal control circuit 242*d* may be electrically connected to the fourth memory region 241*d*. The fourth internal control circuit 242*d* may output the internal data ID<1:K> output from the fourth memory region 241*d* through the input/output line JO during the read operation and the refresh operation. The fourth internal control circuit 242*d* may output the internal data ID<1:K> load on the input/output line JO to the fourth memory region 241*d* during the write operation and the refresh operation. The fourth internal control circuit 242*d* may be implemented using a general differential amplification circuit that senses and amplifies the internal data ID<1:K>.

Figure 20:
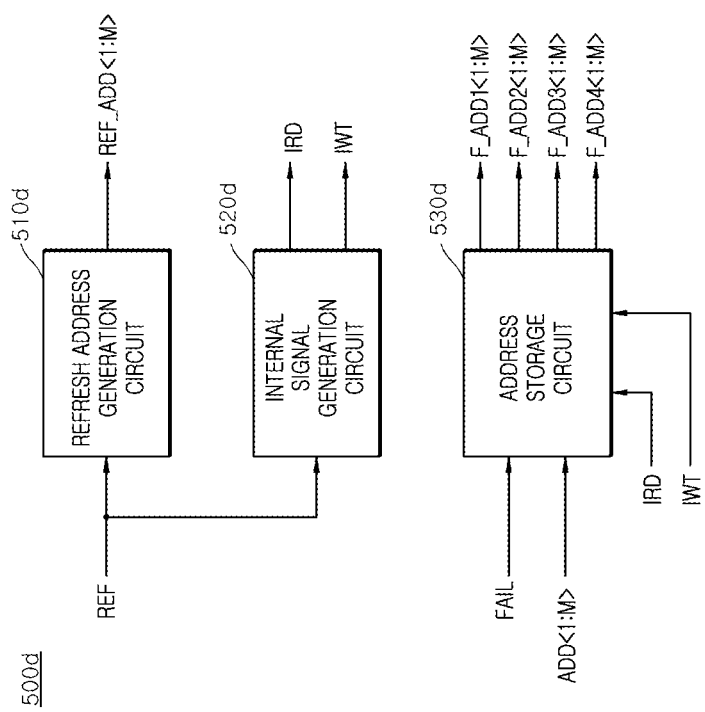
FIG. 20 is a block diagram illustrating a configuration of a refresh control circuit included in the semiconductor device illustrated in FIG. 18.

FIG. 20 is a block diagram illustrating a configuration according to an embodiment of the refresh control circuit 500*d* illustrated in FIG. 18. As illustrated in FIG. 20, the refresh control circuit 500*d* may include a refresh address generation circuit 510*d*, an internal signal generation circuit 520*d*, and an address storage circuit 530*d*.

The refresh address generation circuit 510*d* may generate the refresh address signal REF_ADD<1:M> for sequentially activating the multiple word lines when the refresh signal REF is input. The refresh address generation circuit 510*d* may generate the refresh address signal REF_ADD<1:M> that is counted when the refresh signal REF is input.

The internal signal generation circuit 520*d* may generate the internal read signal IRD and the internal write signal IWT for performing the read modify write operation when the refresh signal REF is input. The internal signal generation circuit 520*d* may generate the internal read signal IRD when the refresh signal REF is input, and then, may generate the internal write signal IWT. A time difference from the time when the internal read signal IRD is generated to the time when the internal write signal IWT is generated may be set to be longer than the time for correcting the error of the internal data ID<1:K> in the error correction circuit 400*d*.

The address storage circuit 530*d* may store the address signal ADD<1:M> as first to fourth failure signals F_ADD1<1:M>~F_ADD4<1:M> when the failure detection signal FAIL is input. The address storage circuit 530*d* may output the stored first to fourth failure address signals F_ADD1<1:M>~F_ADD4<1:M> when the internal read signal IRD is input. The address storage circuit 530*d* may output the stored first to fourth failure address signals F_ADD1<1:M>~F_ADD4<1:M> when the internal write signal IWT is input. The first failure address signal F_ADD1<1:M> may be generated from the address signal ADD<1:M> including information on a location where the internal data ID<1:K> including an error is stored in the first memory region 211*d*. The second failure address signal F_ADD2<1:M> may be generated from the address signal ADD<1:M> including information on a location where the internal data ID<1:K> including an error is stored in the second memory region 221*d*. The third failure address signal F_ADD3<1:M> may be generated from the address signal ADD<1:M> including information on a location where the internal data ID<1:K> including an error is stored in the third memory region 231*d*. The fourth failure address signal F_ADD4<1:M> may be generated from the address signal ADD<1:M> including information on a location where the internal data ID<1:K> including an error is stored in the fourth memory region 241*d*. The address storage circuit 530*d* may be implemented to include the first address storage circuit 213*c*, the second address storage circuit 223*c*, the third address storage circuit 233*c*, and the fourth address storage circuit 243*c* illustrated in FIG. 14.

Figure 21:
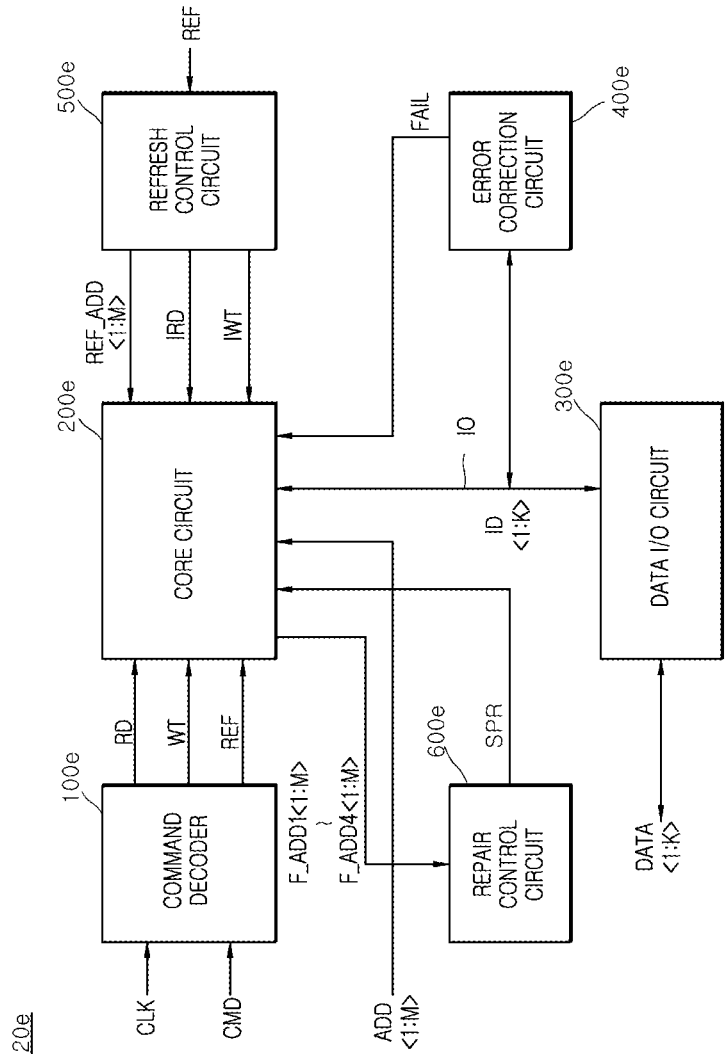
FIG. 21 is a block diagram illustrating a configuration of a semiconductor device according to another embodiment of the present disclosure.

FIG. 21 is a block diagram illustrating a configuration of a semiconductor device 20*e* according to another embodiment of the semiconductor device 20 illustrated in FIG. 2. As illustrated in FIG. 21, the semiconductor device 20*e* may include a command decoder 100e, a core circuit 200e, a data input/output circuit 300e, an error correction circuit 400e, a refresh control circuit 500e, and a repair control circuit 600e.

The command decoder 100e may be synchronized with a clock signal CLK to generate a read signal RD, a write signal WT, and a refresh signal REF, one of which is selectively enabled from a command signal CMD. The command decoder 100e may generate the read signal RD for performing a read operation by decoding the command signal CMD in synchronization with the clock signal CLK. The command decoder 100e may generate the write signal WT for performing a write operation by decoding the command signal CMD in synchronization with the clock signal CLK. The command decoder 100e may generate the refresh signal REF for performing a refresh operation by decoding the command signal CMD in synchronization with the clock signal CLK.

The core circuit 200e may output internal data ID<1:K> stored therein based on the read signal RD and an address signal ADD<1:M> during the read operation. The core circuit 200e may store the internal data ID<1:K> based on the write signal WT and the address signal ADD<1:M> during the write operation. The core circuit 200e may sequentially activate multiple word lines based on the refresh signal REF and a refresh address signal REF_ADD<1:M> during the refresh operation. The core circuit 200e may store the address signal ADD<1:M> as first to fourth failure address signals F_ADD1<1:M>~F_ADD4<1:M> when a failure detection signal FAIL is input during the read operation. The core circuit 200e may output the stored first to fourth failure address signals F_ADD1<1:M>~F_ADD4<1:M> to the repair control circuit 600e. During the refresh operation, the core circuit 200e may perform a read modify write operation to output the internal data ID<1:K> based on the first to fourth failure address signals F_ADD1<1:M>~F_ADD4<1:M>, and may store the error-corrected internal data ID<1:K>. During the refresh operation, the core circuit 200e may output the internal data ID<1:K> based on an internal read signal IRD and the first to fourth failure address signals F_ADD1<1:M>~F_ADD4<1:M>. During the refresh operation, the core circuit 200e may store the error-corrected internal data ID<1:K> base on an internal write signal IWT and the first to fourth failure address signals F_ADD1<1:M>~F_ADD4<1:M>. The core circuit 200e may replace the word line activated by the first to fourth failure address signals F_ADD1<1:M>~F_ADD4<1:M> with another word line when a repair signal SPR is input during the refresh operation. During the refresh operation, the core circuit 200e may output the internal data ID<1:K> by activating another word line replaced by the first to fourth failure address signals F_ADD1<1:M>~F_ADD4<1:M> when the repair signal SPR is input, and may store the error-corrected internal data ID<1:K>. The replacing word line by the first to fourth failure address signals F_ADD1<1:M>~F_ADD4<1:M> may be set as a general word line or an additionally provided redundancy word line. The internal data ID<1:K> may be input through an input/output line JO during the write operation and the refresh operation. The number of bits "K" of the internal data ID<1:K> may be set to various numbers according to an embodiment. Because the core circuit 200e is implemented in the same configuration as the core circuit 200c shown in FIG. 14 and performs the same operation, a detailed description thereof will be omitted.

The data input/output circuit 300e may buffer the internal data ID<1:K> loaded on the input/output line IO to generate data DATA<1:K> during the read operation. The data input/output circuit 300e may output the generated data DATA<1:K> to the controller (10 of FIG. 1) during the read operation. The data input/output circuit 300e may receive the data DATA<1:K> from the controller (10 of FIG. 1) and may buffer the data DATA<1:K> to generated the internal data ID<1:K> during the write operation. The data input/output circuit 300e may output the generated internal data ID<1:K> to the input/output line JO during the write operation. Although FIG. 21 illustrates the input/output line IO with a single line, the input/output line IO may be configured to include multiple lines. The number of bits "K" of the data DATA<1:K> may be set to various numbers according to an embodiment.

The error correction circuit 400e may detect an error of the internal data ID<1:K> loaded on the input/output line IO during the read operation and the refresh operation. The error correction circuit 400e may correct the error of the internal data ID<1:K> and may output the error-corrected internal data ID<1:K> to the input/output line IO during the read operation and the refresh operation. The error correction circuit 400e may generate the failure detection signal FAIL that is enabled when an error occurs in the internal data ID<1:K> loaded on the input/output line IO during the read operation. The error correction circuit 400e may detect the error of the internal data ID<1:K> loaded on the input/output line IO during the write operation. The error correction circuit 400e may correct the error of the internal data ID<1:K> and may output the error-corrected internal data ID<1:K> to the input/output line IO during the write operation. The error correction circuit 400 may be implemented using a general ECC circuit that corrects an error using an error correction code (ECC). Because the error correction circuit 400e is implemented in the same configuration as the error correction circuit 400c shown in FIG. 15 and performs the same operation, a detailed description thereof will be omitted.

The refresh control circuit 500e may generate the refresh address signal REF_ADD<1:M> for sequentially activating the multiple word lines when the refresh signal REF is input. When the refresh signal REF is input, the refresh control circuit 500e may generate the internal read signal IRD and the internal write signal IWT for performing a read modify write operation. The refresh control circuit 500e may generate the internal read signal IRD and the internal write signal IWT that are sequentially generated when the refresh signal REF is input. A time difference from the time when the internal read signal IRD is generated to the time when the internal write signal IWT is generated may be set to be longer than the time for correcting the error of the internal data ID<1:K> in the error correction circuit 400e. Because the refresh control circuit 500e is implemented in the same configuration as the refresh control circuit 500c shown in FIG. 16 and performs the same operation, a detailed description thereof will be omitted.

The repair control circuit 600e may generate a repair signal SPR based on the first to fourth failure address signals F_ADD1<1:M>~F_ADD4<1:M>. The repair control circuit 600e may generate the repair signal SPR generated when the first to fourth failure address signals F_ADD1<1:M>~F_ADD4<1:M> are repeatedly generated with the same logic level combination. The repair control circuit 600e may generate the repair signal SPR generated when the first to fourth failure address signals F_ADD1<1:M> to F_ADD4<1:M> are generated at least twice or more with the same logic level combination. For example, the repair control circuit 600e may generate the repair signal SPR generated when the first failure address signal F_ADD1<1:M> is repeatedly generated twice with the same logic level combination.

The above-described semiconductor device 20e may be synchronized with the clock signal CLK to generate the data DATA<1:K> from the internal data ID<1:K> stored therein and to output the data DATA<1:K> to the controller (10 of FIG. 1) during the read operation. The semiconductor device 20e may receive the data DATA<1:K> from the controller (10 of FIG. 1) in synchronization with the clock signal CLK to generate and store the internal data ID<1:K> during the write operation. The semiconductor device 20e may perform the refresh operation based on the refresh address signal REF_ADD<1:M> during the refresh operation. The semiconductor device 20e may store the error-corrected internal data ID<1:K> based on the first to fourth failure address signals F_ADD1<1:M>~F_ADD4<1:M> during the refresh operation. When the first to fourth failure address signals F_ADD1<1:M> to F_ADD4<1:M> are repeatedly generated with the same logic level combination during the refresh operation, the semiconductor device 20e may store the error-corrected internal data ID<1:K> by replacing the word line in which the internal data ID<1:K> is stored with another word line.

Figure 22:
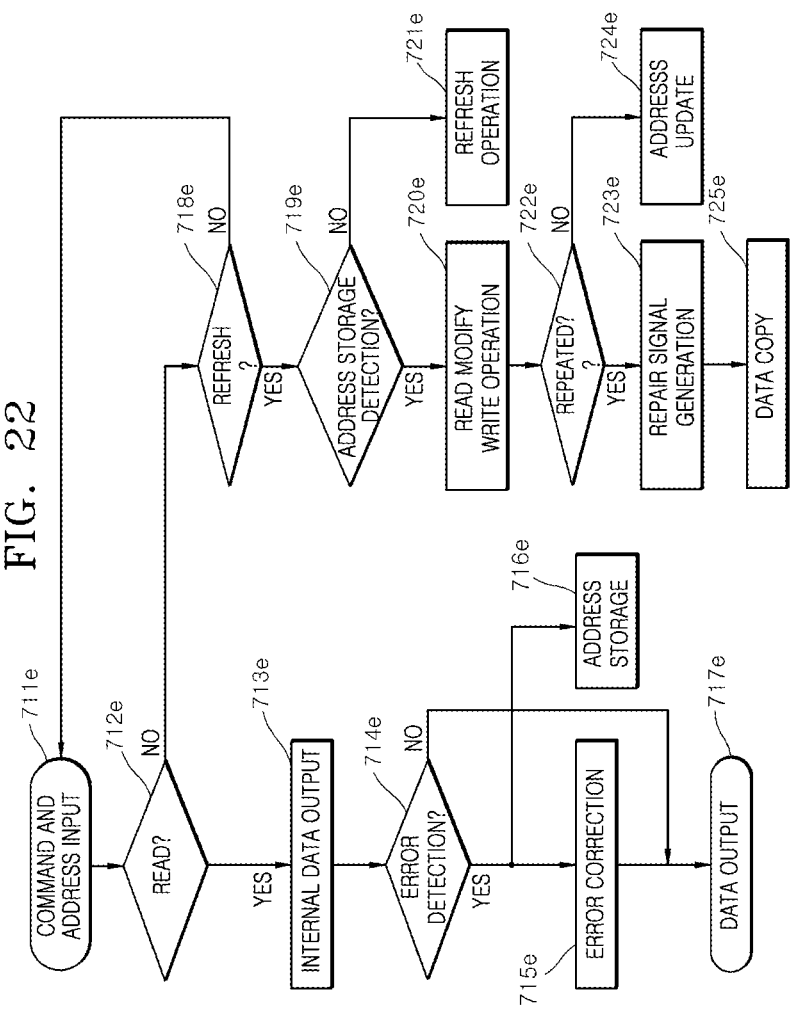
FIG. 22 is a flowchart illustrating an error correction method of a semiconductor system according to another embodiment of the present disclosure.

FIG. 22 is a flowchart illustrating an error correction method of a semiconductor system according to another embodiment of the present disclosure. The error correction method of a semiconductor system according to another embodiment of the present invention will be described with reference to FIG. 22 as follows. The error correction method may include a command and address input operation 711e, a read detection operation 712e, an internal data output operation 713e, an error detection operation 714e, an error correction operation 715e, an address storage operation 716e, a data output operation 717e, a refresh detection operation 718e, an address storage detection operation 719e, a read modify write operation 720e, a refresh operation 721e, a repetition detection operation 722e, a repair signal generation operation 723e, an address update operation 724e, and a data copy operation 725e.

The command and address input operation 711e, the read detection operation 712e, the internal data output operation 713e, the error detection operation 714e, the error correction operation 715e, the address storage operation 716e, the data output operation 717e, the refresh detection operation 718e, the address storage detection operation 719e, the read modify write operation 720e, and the refresh operation 721e are the same as the command and address input operation 611c, the read detection operation 612c, the internal data output operation 613c, the error detection operation 614c, the error correction operation 615c, the address storage operation 616c, the data output operation 617c, the refresh detection operation 618c, the address storage detection operation 619c, the read modify write operation 620c, and the refresh operation 621c, respectively, so that detailed descriptions will be omitted.

The repetition detection operation 722e may be set as an operation of detecting a case in which first to fourth failure address signals F_ADD1<1:M>~F_ADD4<1:M> stored in the address storage operation 716e are generated with the same logic level combination. The repetition detection operation 722e may correspond to an operation of detecting a case in which the first to fourth failure address signals F_ADD1<1:M>~F_ADD4<1:M> are generated at least twice or more with the same logic level combination. When the first to fourth failure address signals F_ADD1<1:M>~F_ADD4<1:M> are generated at least twice with the same logic level combination (YES) in the repetition detection operation 722e, the repair signal generation operation 723e may be entered. When the first to fourth failure address signals F_ADD1<1:M>~F_ADD4<1:M> are not generated with the same logic level combination (NO) in the repetition detection operation 722e, the address update operation 724e may be entered.

The repair signal generation operation 723e may be set as an operation of generating a repair signal SPR when the first to fourth failure address signals F_ADD1<1:M>~F_ADD4<1:M> are generated with the same logic level combination (YES). In the repair signal generation operation 723e, the repair control circuit (600e of FIG. 21) may generate the repair signal SPR generated when the first to fourth failure address signals F_ADD1<1:M>~F_ADD4<1:M> are repeatedly generated with the same logic level combination.

The address update operation 724e may be set as an operation of updating the first to fourth failure address signals F_ADD1<1:M>~F_ADD4<1:M> when the first to fourth failure address signals F_ADD1<1:M>~F_ADD4<1:M> are not generated with the same logic level combination (NO). In the address update operation 724e, the core circuit (200e of FIG. 21) may update the address signal ADD<1:M> to the first to fourth failure address signals F_ADD1<1:M> to F_ADD4<1:M> when the failure detection signal FAIL is input during the read operation.

The data copy operation 725e may be set as an operation of copying the error-corrected internal data ID<1:K>. The data copy operation 725e may be set as an operation of storing the error-corrected internal data ID<1:K> corrected by the error correction circuit (400e of FIG. 21) in another word line other than the word line activated by the first to fourth failure address signals F_ADD1<1:M>~F_ADD4<1:M>.

The error correction operation according to another embodiment of the present disclosure stores the address signal of the location where the error has occurred as a failure address signal, and replaces the word line activated by the failure address with another word line and stores the error-corrected internal data when the failure address signal is repeatedly generated with the same logic level combination during the refresh operation, thereby preventing repeated errors in the internal data. In addition, when the failure address signal is repeatedly generated with the same logic level combination during the refresh operation, the error correction operation replaces the word line activated by the failure address signal with another word line and stores the error-corrected internal data, thereby preventing the error correction circuit from being unable to correct the internal data error.

Figure 23:
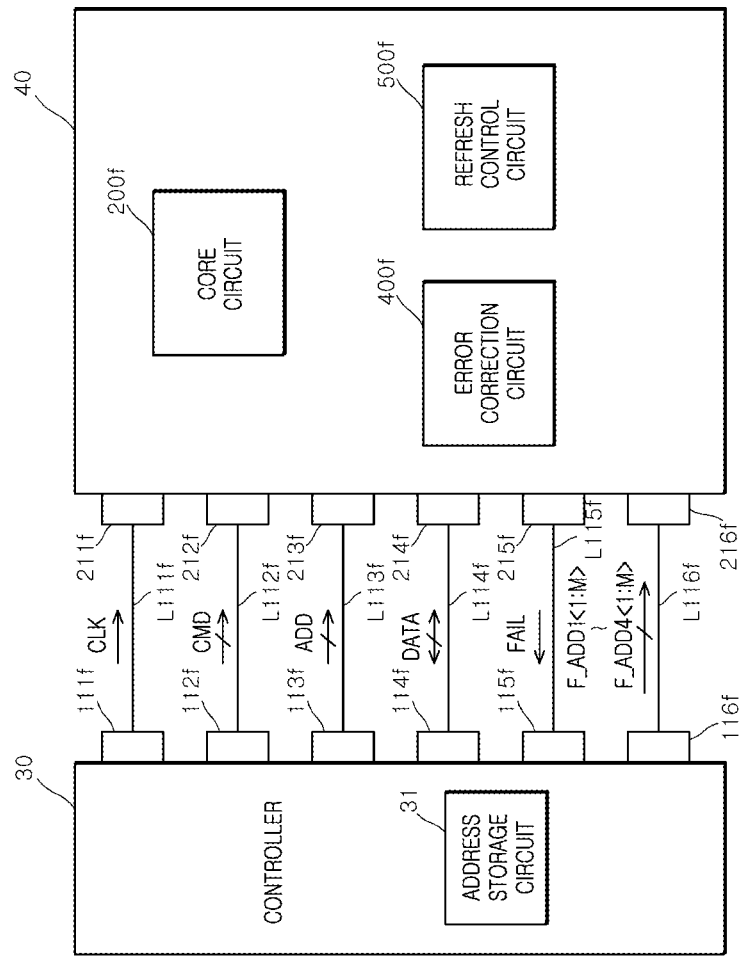
FIG. 23 is a block diagram illustrating a configuration of a semiconductor system according to another embodiment of the present disclosure.

FIG. 23 is a block diagram illustrating a configuration of a semiconductor system according to another embodiment of the present disclosure. As illustrated in FIG. 23, the semiconductor system 2 according to another embodiment of the present disclosure may include a controller 30 and a semiconductor device 40. The controller 30 may include an address storage circuit 31. The semiconductor device 40 may include a core circuit 200f, an error correction circuit 400f, and a refresh control circuit 500f.

The controller 30 may include a first control pin 111f, a second control pin 112f, a third control pin 113f, a fourth control pin 114f, a fifth control pin 115f, and a sixth control pin 116f. The semiconductor device 40 may include a first semiconductor pin 211f, a second semiconductor pin 212f, a third semiconductor pin 213f, a fourth semiconductor pin 214f, a fifth semiconductor pin 215f, and a sixth semiconductor pin 216f. The first control pin 111f and the first semiconductor pin 211f may be connected to each other through a first transmission line L111f. The second control pin 112f and the second semiconductor pin 212f may be connected to each other through a second transmission line L112f. The third control pin 113f and the third semiconductor pin 213f may be connected to each other through a third transmission line L113f. The fourth control pin 114f and the fourth semiconductor pin 214f may be connected to each other through a fourth transmission line L114f. The fourth control pin 115f and the fifth semiconductor pin 215f may be connected to each other through a fifth transmission line L115f. The sixth control pin 116f and the sixth semiconductor pin 216f may be connected to each other through a sixth transmission line L116f. The controller 30 may transmit a clock signal CLK to the semiconductor device 40 through the first transmission line L111f to control the semiconductor device 40. The controller 30 may transmit a command signal CMD to the semiconductor device 40 through the second transmission line L112f to control the semiconductor device 40. The controller 30 may transmit an address signal ADD to the semiconductor device 40 through the third transmission line L113f to control the semiconductor device 40. The controller 30 may receive a data DATA from the semiconductor device 40 through the fourth transmission line L114f or may transmit the data DATA to the semiconductor device 40 through the fourth transmission line L114f. The controller 30 may receive a failure detection signal FAIL through the fifth transmission line L115f. The controller 30 may output first to fourth failure address signals F_ADD1<1:M>~F_ADD4<1:M> through the sixth transmission line L116f.

The controller 30 may output the clock signal CLK, the command signal CMD, and the address signal ADD for a read operation to the semiconductor device 40. The controller 30 may receive the data DATA from the semiconductor device 40 during the read operation. The controller 30 may output the clock signal CLK, the command signal CMD, the address signal ADD, and the data DATA for a write operation to the semiconductor device 40. The controller may output the clock signal CLK and the command signal CMD for a refresh operation to the semiconductor device 40. The command signal CMD, the address signal ADD, and the data DATA may be sequentially input and output in synchronization with an odd pulse or an even pulse included in the clock signal CLK.

The address storage circuit 31 may store the address signal ADD as the first to fourth failure address signals F_ADD1<1:M>~F_ADD4<1:M> when a failure signal FAIL is input during the read operation. The address storage circuit 31 may output the stored first to fourth failure address signals F_ADD1<1:M>~F_ADD4<1:M> during the refresh operation. The address storage circuit 31 may be implemented to include the first address storage circuit 213c, the second address storage circuit 223c, the third address storage circuit 233c, and the fourth address storage circuit 243c illustrated in FIG. 14.

The core circuit 200f may output the data DATA based on the command signal CMD and the address signal ADD in synchronization with the clock signal CLK during the read operation. The core circuit 200f may receive and store the data DATA therein based on the command signal CMD and the address signal ADD in synchronization with the clock signal CLK during the write operation. The core circuit 200f may sequentially activate multiple word lines included therein based on the command signal CMD in synchronization with the clock signal CLK during the refresh operation. The core circuit 200f may store the error-corrected internal data (ID<1:K> of FIG. 24) based on the first to fourth failure address signals F_ADD1<1:M>~F_ADD4<1:M> during the refresh operation.

The error correction circuit 400f may detect an error of the internal data (ID<1:K> of FIG. 24) to generate the failure detection signal FAIL during the read operation. The error correction circuit 400f may correct the error included in the internal data (ID<1:K> of FIG. 24) during the read operation and the refresh operation.

The refresh control circuit 500f may generate a refresh address signal (REF_ADD<1:M> of FIG. 24) for sequentially activating the multiple word lines during the refresh operation. The refresh control circuit 500f may generate an internal read signal (IRD of FIG. 24) and an internal write signal (IWT of FIG. 24) for performing a read modify write operation during the refresh operation.

Figure 24:
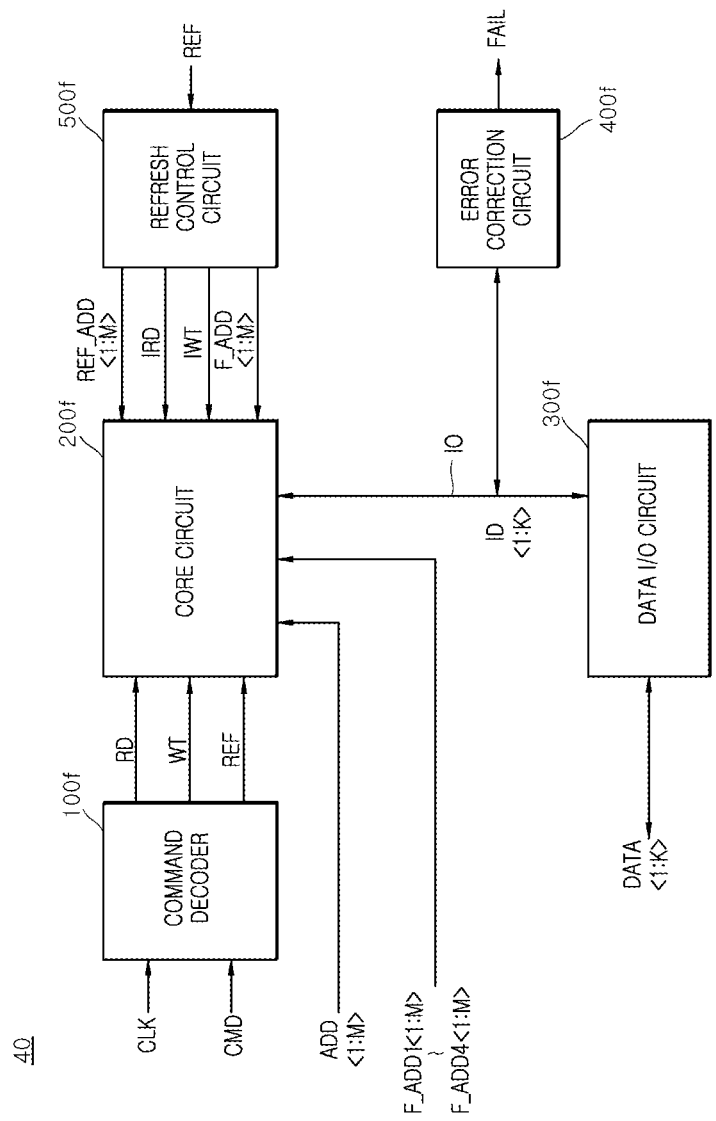
FIG. 24 is a block diagram illustrating a configuration of a semiconductor device included in the semiconductor system illustrated in FIG. 23.

FIG. 24 is a block diagram illustrating a configuration according to another embodiment of the semiconductor device 40 illustrated in FIG. 23. As illustrated in FIG. 24, the semiconductor device 40 may include a command decoder 100f, a core circuit 200f, a data input/output circuit 300f, an error correction circuit 400f, and a refresh control circuit 500f.

The command decoder 100f may be synchronized with a clock signal CLK to generate a read signal RD, a write signal WT, and a refresh signal REF, one of which is selectively enabled from a command signal CMD. The command decoder 100f may generate the read signal RD for performing a read operation by decoding the command signal CMD in synchronization with the clock signal CLK. The command decoder 100f may generate the write signal WT for performing a write operation by decoding the command signal CMD in synchronization with the clock signal CLK. The command decoder 100f may generate the refresh signal REF for performing a refresh operation by decoding the command signal CMD in synchronization with the clock signal CLK.

The core circuit 200f may output internal data ID<1:K> stored therein based on the read signal RD and the address signal ADD<1:M> during the read operation. The core circuit 200f may store the internal data ID<1:K> based on the write signal WT and the address signal ADD<1:M> during the write operation. The core circuit 200f may sequentially activate the multiple word lines based on the refresh signal REF and the refresh address signal REF_ADD<1:M> during the refresh operation. The core circuit 200f may output the internal data ID<1:K> based on the first to fourth failure address signals F_ADD1<1:M>~F_ADD4<1:M> and may store the error-corrected internal data ID<1:K> during the refresh operation. The core circuit 200f may output the internal data ID<1:K> based on the internal read signal IRD and the first to fourth failure address signals F_ADD1<1:M>~F_ADD4<1:M> during the refresh operation. The core circuit 200f may store the error-corrected internal data ID<1:K> based on the internal write signal IWT and the first to fourth failure address signals F_ADD1<1:M>~F_ADD4<1:M> during the refresh operation. The internal data ID<1:K> may be output through an input/output line IO during the read operation and the refresh operation. The internal data ID<1:K> may be input through the input/output line IO during the write operation and the refresh operation. The number of bits "K" of the internal data ID<1:K> may be set to various numbers according to an embodiment. The number of bits "M" of the address signal ADD<1:M>, the refresh address signal REF_ADD<1:M>, and the first to fourth failure address signals F_ADD1<1:M>~F_ADD4<1:M> may be set to various numbers according to an embodiment. Because the core circuit 200f is implemented in the same configuration as the core circuit 200d shown in FIG. 19 and performs the same operation, a detailed description will be omitted.

The data input/output circuit 300f may buffer the internal data ID<1:K> loaded on the input/output line IO to generate the data DATA<1:K> during the read operation. The data input/output circuit 300f may output the generated data DATA<1:K> to the controller (30 of FIG. 23) during the read operation. The data input/output circuit 300f may receive the data DATA<1:K> from the controller 30 and may buffer the data DATA<1:K> to generate the internal data ID<1:K> during the write operation. The data input/output circuit 300f may output the generated internal data ID<1:K> to the input/output line IO during the write operation. Although FIG. 24 illustrates the input/output line IO with a single line, the input/output line IO may be configured to include multiple lines. The number of bits "K" of the data DATA<1:K> may be set to various numbers according to an embodiment.

The error correction circuit 400f may detect an error of the internal data ID<1:K> loaded on the input/output line IO during the read operation and the refresh operation. The error correction circuit 400f may correct the error of the internal data ID<1:K> during the read operation and the refresh operation and may output the error-corrected internal data ID<1:K> to the input/output line IO. The error correction circuit 400f may generate the failure detection signal FAIL which is enabled when an error occurs in the internal data ID<1:K> loaded on the input/output line JO during the read operation. The error correction circuit 400f may output the generated failure detection signal FAIL to the controller 30 during the read operation. The error correction circuit 400f may detect the error of the internal data ID<1:K> loaded on the input/output line IO during the write operation. The error correction circuit 400f may correct the error of the internal data ID<1:K> during the write operation and may output the error-corrected internal data ID<1:K> to the input/output line IO. The error correction circuit 400f may be implemented using a general ECC circuit that corrects an error using an error correction code (ECC). Because the error correction circuit 400f is implemented in the same configuration as the error correction circuit 400c shown in FIG. 15 and performs the same operation, a detailed description will be omitted.

The refresh control circuit 500f may generate the refresh address signals REF_ADD<1:M> for sequentially activating the multiple word lines when the refresh signal REF is input. The refresh control circuit 500f may generate the internal read signal IRD and the internal write signal IWT for performing the read modify write operation when the refresh signal REF is input. The refresh control circuit 500f may generate the internal read signal IRD and the internal write signal IWT which are sequentially generated when the refresh signal REF is input. A time difference from the time when the internal read signal IRD is generated to the time when the internal write signal IWT is generated may be set to be longer than the time for correcting the error of the internal data ID<1:K> in the error correction circuit 400f. Because the refresh control circuit 500f is implemented in the same configuration as the refresh control circuit 500c shown in FIG. 16 and performs the same operation, a detailed description will be omitted.

The described-above semiconductor device 40 may be synchronized with the clock signal CLK to generate the data DATA<1:K> from the internal data ID<1:K> stored therein and to output the data DATA<1:K> to the controller 30 during the read operation. The semiconductor device 40 may receive the data DATA<1:K> from the controller 30 in synchronization with the clock signal CLK to generate and store the internal data ID<1:K> therein during the write operation. The semiconductor device 40 may perform the refresh operation based on the refresh address signal REF_ADD<1:M> during the refresh operation. The semiconductor device 40 may store the error-corrected internal data ID<1:K> based on the first to fourth failure address signals F_ADD1<1:M>~F_ADD4<1:M> during the refresh operation.

Figure 25:
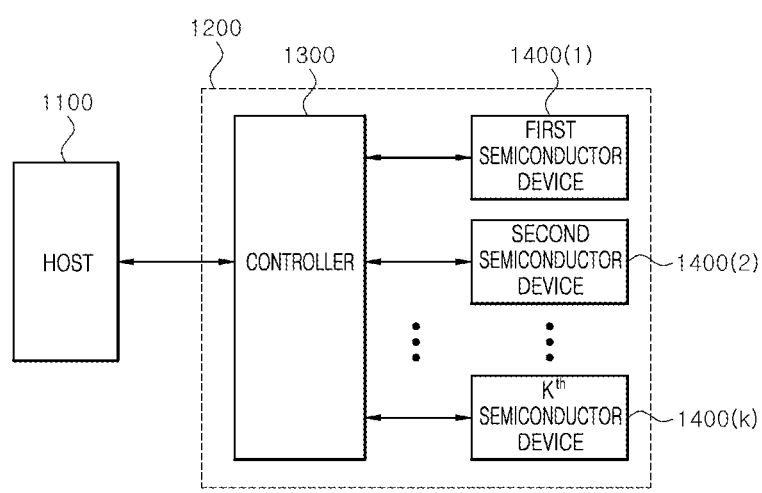
FIG. 25 is a diagram illustrating a configuration according to an embodiment of an electronic system to which the semiconductor system shown in FIGS. 1 to 24 is applied.

FIG. 25 is a block diagram illustrating a configuration according to an embodiment of an electronic system 1000 according to an embodiment of the present disclosure. As illustrated in FIG. 25, the electronic system 1000 may include a host 1100 and a semiconductor system 1200.

The host 1100 and the semiconductor system 1200 may mutually transmit signals using an interface protocol. The interface protocol used between the host 1100 and the semiconductor system 1200 may include multi-media card (MMC), enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), or the like.

The semiconductor system 1200 may include a controller 1300 and semiconductor devices 1400(K:1). The controller 1300 may control the semiconductor devices 1400(K:1) to perform a read operation, a write operation, a refresh operation, and a repair operation. Each of the semiconductor devices 1400(K:1) may secure the reliability of internal data by additionally refreshing a word line for inputting and outputting the internal data including an error when a refresh signal is repeatedly input for the first set number of times during the refresh operation. Each of the semiconductor devices 1400(K:1) may secure the reliability of the internal data by additionally refreshing the word line for inputting and outputting the internal data including the error when an address signal for selecting the internal data including the error is input for the second set number of times during the refresh operation. When the address signal for selecting the internal data including the error is input for the third set number of times during the refresh operation, each of the semiconductor devices 1400(K:1) may secure the reliability of the internal data by replacing the word line for inputting and outputting the internal data including the error with a repair line. Each of the semiconductor devices 1400(K:1) may prevent repeated errors in the internal data by correcting the errors in internal data stored in the word line activated by a failure address signal during a refresh operation and storing the error-corrected internal data. Each of the semiconductor devices 1400(K:1) may prevent a case in which the error in the internal data cannot be corrected by the error correction circuit by correcting the error of the internal data stored in the word line activated by the failure address signal and store the error-corrected internal data during the refresh operation. When a failure address signal is repeatedly generated with the same logic level combination during the refresh operation, each of the semiconductor devices 1400(K:1) may prevent repeated errors in the internal data by replacing the word line activated by the failure address signal with another word line to store the error-corrected internal data. When the failure address signal is repeatedly generated with the same logic level combination during the refresh operation, each of the semiconductor devices 1400(K:1) may prevent a case in which the error in the internal data cannot be corrected in the error correction circuit by replacing the word line activated by the failure address signal with another word line to store the error-corrected internal data.

The controller may be implemented with the controller 10 illustrated in FIG. 1 or the controller 30 illustrated in FIG. 23. Each of the semiconductor devices 1400(K:1) may be implemented with the semiconductor device 20 illustrated in FIGS. 1 and 2 or the semiconductor device 40 illustrated in FIG. 23. According to an embodiment, each of the semiconductor devices 1400(K:1) may be implemented with one of a dynamic random access memory (DRAM), a phase change random access memory (PRAM), a resistive random access memory (RRAM), a magnetic random access memory (MRAM), and a ferroelectric random access memory (FRAM).

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
   an error correction circuit configured to detect an error included in internal data, to generate a failure detection signal during a read operation, and to correct the error included in the internal data during a refresh operation; and
   a core circuit configured to store an address signal for activating a word line in which the internal data including the error is stored as a failure address signal when the failure detection signal is input to the core circuit, and store the error-corrected internal data in the core circuit through a word line activated by the failure address signal during the refresh operation.

2. The semiconductor device of claim 1, wherein during the refresh operation, the core circuit is configured to perform a read modify write operation to output the internal data stored in the core circuit through the word line activated by the failure address signal, and then, store the error-corrected internal data in the core circuit through the word line activated by the failure address signal.

3. The semiconductor device of claim 1, wherein the core circuit includes:
   a memory region configured to output the internal data stored through the word line selected by the address signal to an input and output (input/output) line when a read signal is input to the memory region, perform the refresh operation based on a refresh address signal, output the internal data stored through the word line activated by the failure address signal when an internal read signal is input to the memory region, and then, store the error-corrected internal data when an internal write signal is input to the memory region; and
   an address storage circuit configured to store the address signal as the failure address signal when the failure detection signal is input to the address storage circuit, and output the stored failure address signal when the internal read signal and the internal write signal are input to the address storage circuit.

4. The semiconductor device of claim 1, wherein the error correction circuit includes:
   a parity syndrome generation circuit configured to generate a syndrome signal including error information included in the internal data loaded on the input/output line;
   a syndrome decoder configured to decode the syndrome signal to generate an error correction signal;
   an error corrector configured to correct the error included in the internal data based on the error correction signal to output the error-corrected internal data to the input/output line; and
   a failure detection signal generation circuit configured to detect the error of the internal data to generate the failure detection signal.

5. The semiconductor device of claim 1, further comprising a refresh control circuit configured to generate a refresh address signal that is sequentially counted when the refresh signal is input to the refresh control circuit, generate the internal read signal for performing the read modify write operation, and then generate the internal write signal.

6. The semiconductor device of claim 5, wherein the refresh control circuit includes:
   a refresh address generation circuit configured to generate the refresh address signal that is sequentially counted when the refresh signal is input to the refresh address generation circuit; and
   an internal signal generation circuit configured to generate the internal read signal and the internal write signal that are sequentially generated when the refresh signal is input to the internal signal generation circuit.

7. A semiconductor device comprising:
   an error correction circuit configured to detect an error included in first and second internal data, to generate a failure detection signal during a read operation, and to correct the error included in the first and second internal data during a refresh operation;
   a refresh control circuit configured to store an address signal for activating a word line in which the first and second internal data including an error are stored as first and second failure address signals, to output the first and second failure address signals during the refresh operation, and to control a read modify write operation during the refresh operation; and
   a core circuit configured to output the first and second internal data stored in the core circuit through the word line activated by the first and second failure address signals during the read modify write operation, and then, store the error-corrected first and second internal data.

8. The semiconductor device of claim 7, wherein the error correction circuit includes:
   a parity syndrome generation circuit configured to generate a syndrome signal including error information included in the first and second internal data loaded on an input and output (input/output) line;
   a syndrome decoder configured to decode the syndrome signal to generate an error correction signal;
   an error corrector configured to correct the error included in the first and second internal data based on the error correction signal to output the error-corrected internal data to the input/output line; and
   a failure detection signal generation circuit configured to detect the error of the first and second internal data to generate the failure detection signal.

9. The semiconductor device of claim 7, wherein the refresh control circuit includes:

a refresh address generation circuit configured to generate a refresh address signal that is sequentially counted when a refresh signal is input to the refresh address generation circuit;

an internal signal generation circuit configured to generate an internal read signal and an internal write signal that are sequentially generated when the refresh signal is input to the internal signal generation circuit; and an address storage circuit configured to store the address signal for activating a word line of a first memory region in which the first internal data including an error is stored as the first failure address signal when the failure detection signal is input to the address storage circuit, store the address signal for activating a word line of a second memory region in which the second internal data including an error is stored as the second failure address signal when the failure detection signal is input to the address storage circuit, and output the first failure address signal and the second failure address signal when the internal read signal and the internal write signal are input to the address storage circuit.

10. The semiconductor device of claim 7, wherein the core circuit includes:
   a first memory region configured to output the first internal data stored in the first memory region through a word line activated by the internal read signal and the first failure address that are generated during the read modify write operation, and store the error-corrected first internal data in the first memory region through a word line activated by the internal write signal and the first failure address; and
   a second memory region configured to output the second internal data stored in the second memory region through a word line activated by the internal read signal and the second failure address that are generated during the read modify write operation, and store the error-corrected second internal data in the second memory region through a word line activated by the internal write signal and the second failure address.

11. The semiconductor device of claim 10,
wherein the first memory region is configured to output the first internal data stored in the first memory region through the word line activated by the read signal and the address signal to the input/output line during the read operation, store the first internal data in the first memory region through the word line activated by a write signal and the address signal during a write operation, and perform the refresh operation in which multiple word lines are sequentially activated by a refresh address signal, and
the second memory region is configured to output the second internal data stored in the second memory region through the word line activated by the read signal and the address signal to the input/output line during the read operation, store the second internal data in the second memory region through a word line activated by the write signal and the address signal during the write operation, and perform the refresh operation in which the multiple word lines are sequentially activated by the refresh address signal.

12. A semiconductor device comprising:
an error correction circuit configured to detect an error included in internal data, to generate a failure detection signal during a read operation, and to correct the error included in the internal data during a refresh operation;

a core circuit configured to store an address signal for activating a word line in which the internal data including the error is stored as a failure address signal when the failure detection signal is input to the core circuit and store the error-corrected internal data in the core circuit through a word line activated by the failure address during the refresh operation; and a repair control circuit configured to generate a repair signal for replacing the word line in which the internal data is stored through with another word line when the failure address signal is generated with the same logic level combination.

13. The semiconductor device of claim 12, wherein the core circuit is configured to perform a read modify write operation during the refresh operation to output the internal data stored in in the core circuit through the word line activated by the failure address signal, and then, store the error-corrected internal data in the core circuit through the word line activated by the failure address signal.

14. The semiconductor device of claim 12, wherein the core circuit is configured to output the stored internal data by replacing the word line activated by the failure address signal with another word line when the repair signal is input during the refresh operation, and store the internal data by replacing the word line activated by the failure address signal with another word line when the repair signal is input during the refresh operation.

15. The semiconductor device of claim 12, wherein the core circuit includes:
   a memory region configured to output the internal data stored through the word line selected by the address signal to an input and output (input/output) line when a read signal is input to the memory region, perform the refresh operation based on a refresh control signal, output the internal data stored through the word line activated by the failure address signal when an internal read signal is input to the memory region, and then, store the error-corrected internal data when an internal write signal is input to the memory region; and
   an address storage circuit configured to store the address signal as the failure address signal when the failure detection signal is input to the address storage circuit, and output the stored failure address signal when the internal read signal and the internal write signal are input to the address storage circuit.

16. The semiconductor device of claim 12, wherein the error correction circuit includes:
   a parity syndrome generation circuit configured to generate a syndrome signal including error information included in the internal data loaded on the input/output line;
   a syndrome decoder configured to decode the syndrome signal to generate an error correction signal;
   an error corrector configured to correct the error included in the internal data based on the error correction signal to output the error-corrected internal data to the input/output line; and
   a failure detection signal generation circuit configured to detect the error of the internal data to generate the failure detection signal.

17. The semiconductor device of claim 12, further comprising a refresh control circuit configured to generate a refresh address signal that is sequentially counted when the refresh signal is input to the refresh control circuit, generate an internal read signal for performing the read modify write operation, and then, generate an internal write signal.

18. The semiconductor device of claim 17, wherein the refresh control circuit includes:
- a refresh address generation circuit configured to generate the refresh address signal that is sequentially counted when the refresh signal is input to the refresh address generation circuit; and
- an internal signal generation circuit configured to generate the internal read signal and the internal write signal that are sequentially generated when the refresh signal is input to the internal signal generation circuit.

19. A semiconductor system comprising:
- a controller configured to input and output (input/output) a command signal, an address signal, and data, to store the address signal as a failure address signal when a failure detection signal is input to the controller, and to output the stored failure address signal during a refresh operation; and
- a semiconductor device configured to detect an error of internal data generated by the address signal to generate the failure detection signal based on the command signal during a read operation, correct the error included in the internal data to output the error-corrected internal data as the data, and correct the error of the internal data stored in the semiconductor device through a word line activated by the failure address signal to store the error-corrected internal data during the refresh operation.

20. The semiconductor system of claim 19, wherein the controller includes an address storage circuit configured to store the address signal as the failure address signal when the failure detection signal is input to the address storage circuit, and output the stored failure address signal to the semiconductor device during the refresh operation.

21. The semiconductor system of claim 19, wherein the semiconductor device includes:
- an error correction circuit configured to detect an error included in internal data loaded on an input/output line, to generate the failure detection signal by the command signal during the read operation, and to correct the error included in the internal data loaded on the input/output line by the command signal during the refresh operation;
- a refresh control circuit configured to generate an internal read signal and an internal write signal that are sequentially generated for performing a read modify write operation during the refresh operation; and
- a core circuit configured to output the internal data stored in the core circuit through the word line activated by the address signal to the input/output line when a read signal generated by the command signal is input to the core circuit, output the internal data stored in the core circuit through the word line activated by the failure address signal when the internal read signal is input to the core circuit, and store the error-corrected internal data when the internal write signal is input to the core circuit.

22. The semiconductor system of claim 21, wherein the error correction circuit includes:
- a parity syndrome generation circuit configured to generate a syndrome signal including error information included in the internal data loaded on the input/output line;
- a syndrome decoder configured to decode the syndrome signal to generate an error correction signal;
- an error corrector configured to correct the error included in the internal data based on the error correction signal to output the error-corrected internal data to the input/output line; and
- a failure detection signal generation circuit configured to detect the error of the internal data to generate the failure detection signal.

23. The semiconductor system of claim 21, wherein the refresh control circuit includes:
- a refresh address generation circuit configured to generate a refresh address signal that are sequentially counted when a refresh signal is input to the refresh address generation circuit; and
- an internal signal generation circuit configured to generate the internal read signal and the internal write signal that are sequentially generated when the refresh signal is input to the internal signal generation circuit.

24. An error correction method comprising:
- performing an address detection operation to detect an error included in internal data output from a memory region during a read operation;
- performing an error correction operation to generate a failure detection signal when an error is included in the internal data and to correct the error of the internal data; and
- performing an address storage operation to store an address signal for activating a word line in which the internal data is stored through as a failure address signal when the failure detection signal occurs, wherein error-corrected internal data is stored through the word line activated by the failure address signal during a refresh operation.

25. The error correction method of claim 24, further comprising performing a data output operation to output the error-corrected internal data to an external device or to output the internal data to the external device when the internal data does not include an error.

26. The error correction method of claim 24, further comprising:
- performing an error storage detection operation to detect the failure address signal during the refresh operation;
- performing a read modify write operation to correct the error of the internal data after performing an internal read operation on the failure address signal and to perform an internal write operation on the failure address to store the error-corrected internal data; and
- performing a refresh operation to activate multiple word lines by a refresh address.

27. The error correction method of claim 26, further comprising:
- performing a repair signal generation operation of generating a repair signal when the failure address signal is generated with the same logic level combination;
- performing an address update operation to store the address signal as the failure address signal when the failure address signal is not generated with the same logic level combination; and
- performing a data copy operation to replace the word line in which the internal data is stored through with another word line by the repair signal and to store the internal data through the replacing word line.

* * * * *